(12) United States Patent
Yonehara et al.

(10) Patent No.: US 8,670,015 B2
(45) Date of Patent: Mar. 11, 2014

(54) SEMICONDUCTOR MEMBER, SEMICONDUCTOR ARTICLE MANUFACTURING METHOD, AND LED ARRAY USING THE MANUFACTURING METHOD

(75) Inventors: Takao Yonehara, Kawasaki (JP); Kenji Yamagata, Sagamihara (JP); Yoshinobu Sekiguchi, Machida (JP); Kojiro Nishi, Irvine, CA (US)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/550,512

(22) Filed: Jul. 16, 2012

(65) Prior Publication Data

US 2012/0282716 A1 Nov. 8, 2012

Related U.S. Application Data

(62) Division of application No. 12/442,902, filed as application No. PCT/JP2007/071267 on Oct. 25, 2007, now Pat. No. 8,237,761.

(30) Foreign Application Priority Data

Oct. 27, 2006 (JP) ................................ 2006-293306
Nov. 17, 2006 (JP) ................................ 2006-311625

(51) Int. Cl.
  *B41J 2/45* (2006.01)
  *H01L 21/30* (2006.01)
  *H01L 21/46* (2006.01)

(52) U.S. Cl.
  USPC ......................................... 347/238; 348/458

(58) Field of Classification Search
  USPC ............ 347/238; 438/34, 455, 456, 458–460, 438/462, 465
  See application file for complete search history.

(56) References Cited

U.S. PATENT DOCUMENTS 5,371,037 A 12/1994 Yonehara
5,580,381 A 12/1996 Yamagata (Continued)

FOREIGN PATENT DOCUMENTS

EP 1 326 289 7/2003
EP 1 463 116 9/2004

(Continued)

OTHER PUBLICATIONS

International Search Report and Written Opinion dated Dec. 4, 2007 in corresponding PCT Application No. PCT/JP2007/071267.

(Continued)

*Primary Examiner* — Hai C Pham
(74) *Attorney, Agent, or Firm* — Fitzpatrick, Cella, Harper and Scinto

(57) ABSTRACT

A novel semiconductor article manufacturing method and the like are provided. A method of manufacturing a semiconductor article having a compound semiconductor multilayer film formed on a semiconductor substrate includes: preparing a member including an etching sacrificial layer (1010), a compound semiconductor multilayer film (1020), an insulating film (2010), and a semiconductor substrate (2000) on a compound semiconductor substrate (1000), and having a first groove (2005) which passes through the semiconductor substrate and the insulating film, and a semiconductor substrate groove (1025) which is a second groove provided in the compound semiconductor multilayer film so as to be connected to the first groove, and bringing an etchant into contact with the etching sacrificial layer through the first groove and then the second groove and etching the etching sacrificial layer to separate the compound semiconductor substrate from the member.

14 Claims, 15 Drawing Sheets

(56) References Cited

U.S. PATENT DOCUMENTS

| | | | |
|---|---|---|---|
| 5,705,421 | A * | 1/1998 | Matsushita et al. ........... 438/459 |
| 5,712,199 | A | 1/1998 | Nakagawa et al. |
| 5,750,000 | A | 5/1998 | Yonehara et al. |
| 5,755,914 | A | 5/1998 | Yonehara |
| 5,763,288 | A | 6/1998 | Sakaguchi et al. |
| 5,840,616 | A | 11/1998 | Sakaguchi et al. |
| 5,868,947 | A | 2/1999 | Sakaguchi et al. |
| 5,970,361 | A | 10/1999 | Kumomi et al. |
| 6,106,613 | A | 8/2000 | Sato et al. |
| 6,140,209 | A | 10/2000 | Iwane et al. |
| 6,143,628 | A | 11/2000 | Sato et al. |
| 6,150,031 | A | 11/2000 | Yonehara |
| 6,156,624 | A | 12/2000 | Yamagata et al. |
| 6,190,937 | B1 | 2/2001 | Nakagawa et al. |
| 6,211,038 | B1 | 4/2001 | Nakagawa et al. |
| 6,258,698 | B1 | 7/2001 | Iwasaki et al. |
| 6,306,729 | B1 | 10/2001 | Sakaguchi et al. |
| 6,331,208 | B1 | 12/2001 | Nishida et al. |
| 6,382,292 | B1 | 5/2002 | Ohmi et al. |
| 6,391,743 | B1 | 5/2002 | Iwane et al. |
| 6,429,095 | B1 | 8/2002 | Sakaguchi et al. |
| 6,452,091 | B1 | 9/2002 | Nakagawa et al. |
| 6,475,323 | B1 | 11/2002 | Ohmi et al. |
| 6,501,101 | B2 | 12/2002 | Murakami et al. |
| 6,566,235 | B2 | 5/2003 | Nishida et al. |
| 6,613,678 | B1 | 9/2003 | Sakaguchi et al. |
| 6,639,327 | B2 | 10/2003 | Momoi et al. |
| 6,653,209 | B1 | 11/2003 | Yamagata |
| 6,677,183 | B2 | 1/2004 | Sakaguchi et al. |
| 6,746,559 | B2 | 6/2004 | Ohmi et al. |
| 6,756,289 | B1 | 6/2004 | Nakagawa et al. |
| 6,891,578 | B2 | 5/2005 | Yonehara et al. |
| 6,913,985 | B2 * | 7/2005 | Ogihara et al. ........... 438/462 |
| 6,972,215 | B2 | 12/2005 | Sakaguchi et al. |
| 6,979,581 | B2 | 12/2005 | Sai |
| 6,998,643 | B2 | 2/2006 | Kim et al. |
| 7,015,507 | B2 | 3/2006 | Yonehara et al. |
| 7,029,950 | B2 | 4/2006 | Yonehara et al. |
| 7,341,923 | B2 | 3/2008 | Yonehara |
| 7,399,693 | B2 | 7/2008 | Sekiguchi et al. |
| 7,408,566 | B2 * | 8/2008 | Ogihara et al. ........... 347/238 |
| 7,495,313 | B2 | 2/2009 | Nayfeh et al. |
| 2002/0030198 | A1 | 3/2002 | Coman |
| 2004/0114652 | A1 | 6/2004 | Yoshikawa |
| 2004/0259331 | A1 | 12/2004 | Ogihara et al. |
| 2005/0082643 | A1 | 4/2005 | Kondo |
| 2005/0087743 | A1 | 4/2005 | Ogihara et al. |
| 2006/0038182 | A1 | 2/2006 | Rogers |
| 2006/0166468 | A1 | 7/2006 | Yonehara et al. |
| 2007/0090365 | A1 | 4/2007 | Hayashi et al. |
| 2009/0061604 | A1 | 3/2009 | Nayfeh et al. |

FOREIGN PATENT DOCUMENTS

| | | |
|---|---|---|
| EP | 1526574 A2 | 4/2005 |
| JP | 9-293930 A | 11/1997 |
| JP | 2000114590 A | 4/2000 |
| JP | 2001-291896 | 10/2001 |
| JP | 2002-151734 | 5/2002 |
| JP | 2003-17742 A | 1/2003 |
| JP | 2005012034 A | 1/2005 |
| JP | 2005150703 A | 6/2005 |
| JP | 2005159071 A | 6/2005 |
| JP | 2005-311072 | 11/2005 |
| JP | 2006216832 A | 8/2006 |
| JP | 2006237061 A | 9/2006 |

OTHER PUBLICATIONS

Official Action dated Jun. 9, 2010 in Russian Application No. 2009120060.

European Office Action dated Nov. 2, 2011 issued during prosecution of related European Application No. 07831001.8.

European Search Report dated Jun. 30, 2011 issued during prosecution of related European Application No. 07831001.8.

Korean Office Action dated Feb. 7, 2011 issued in Korean Application 10-2009-7010704.

Taiwanese Office Action dated Dec. 26, 2011 in Taiwanese Application No. 096140470.

Taiwanese Office Action dated Jun. 27, 2012 in Taiwanese Application No. 096140470.

* cited by examiner

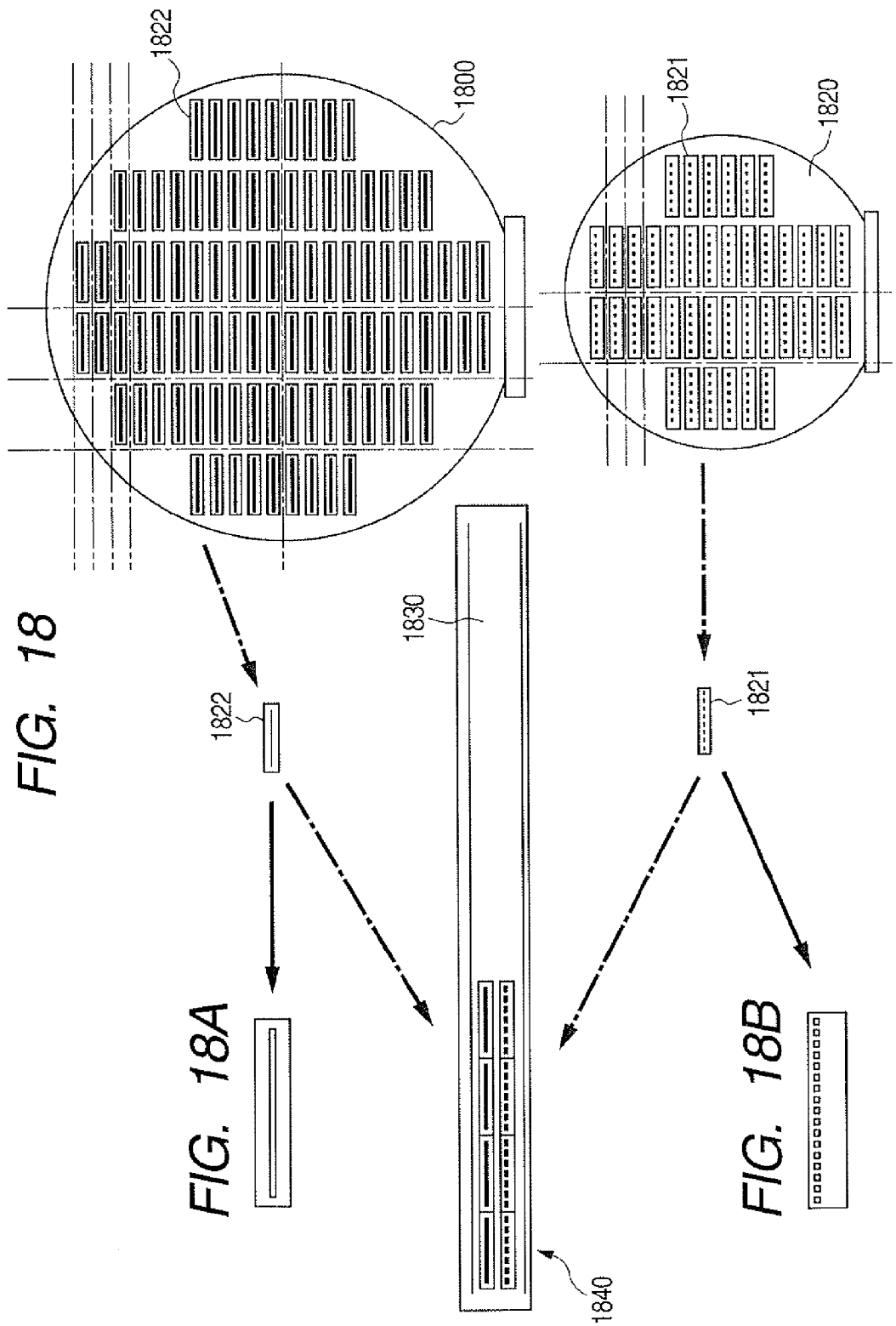

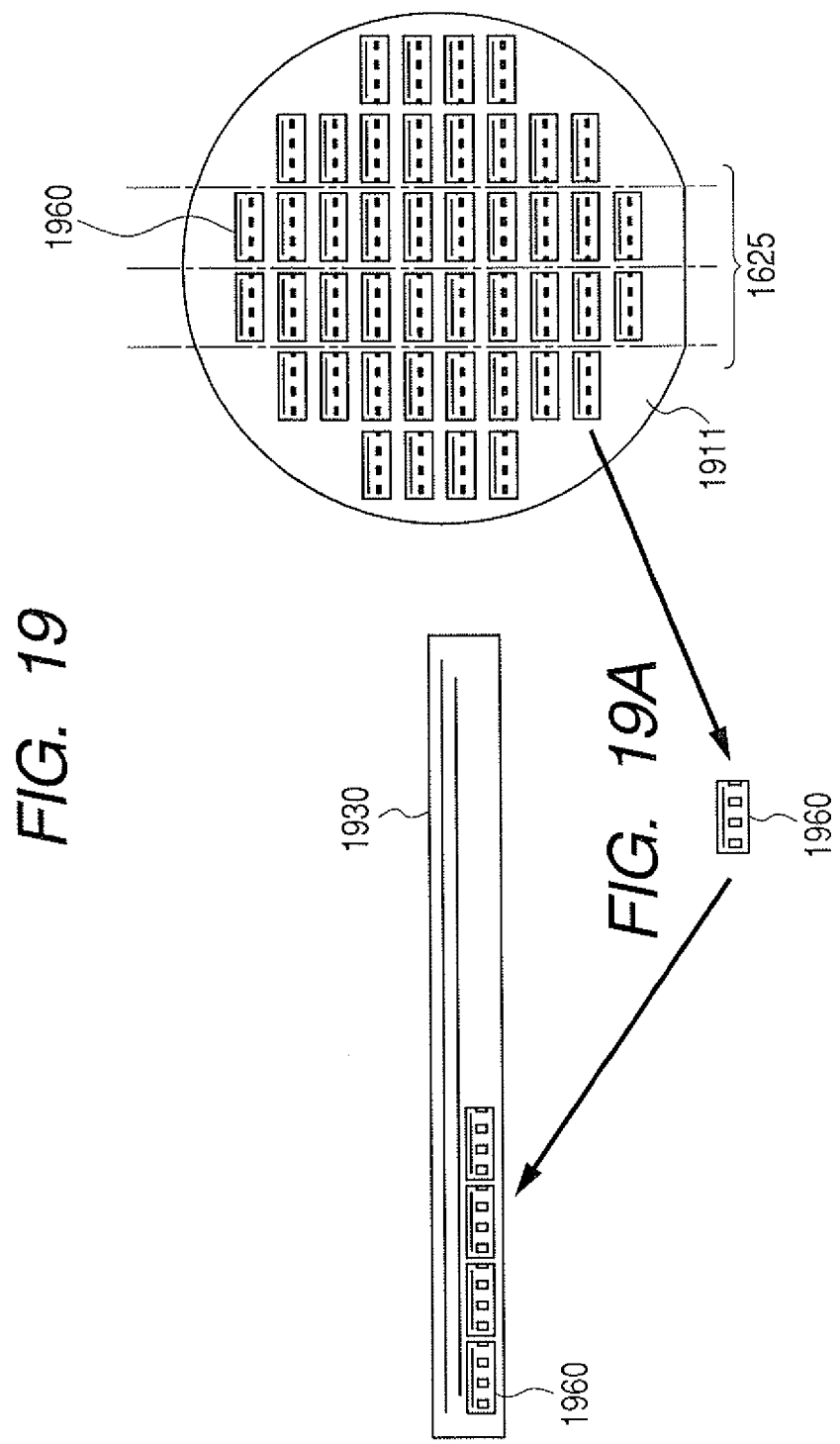

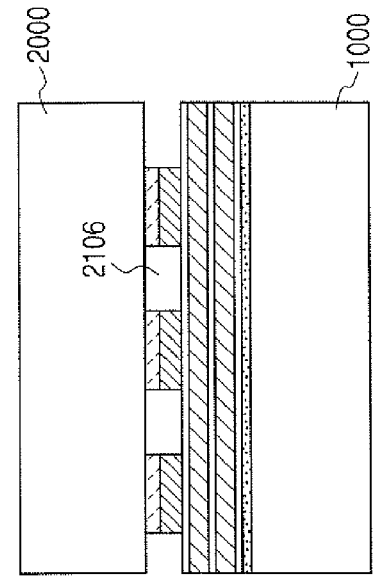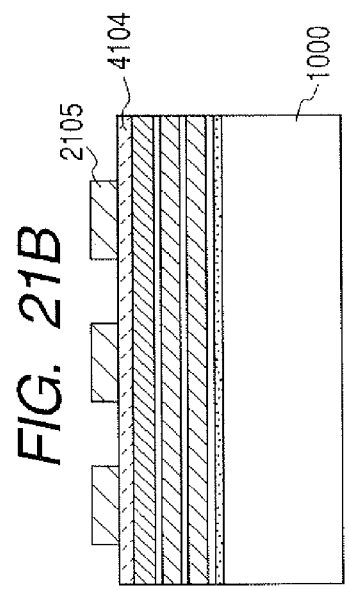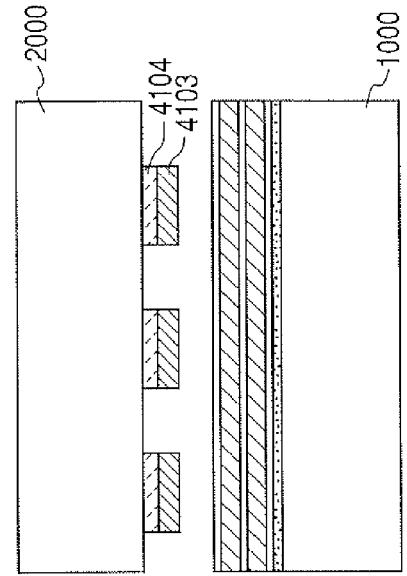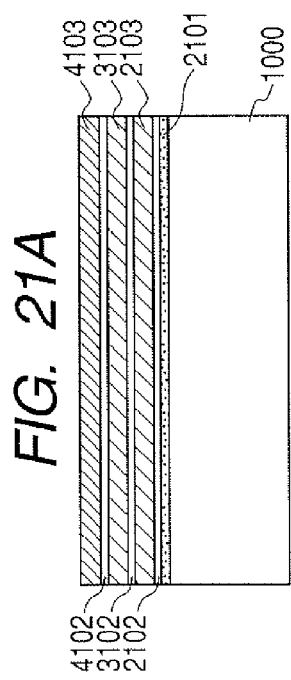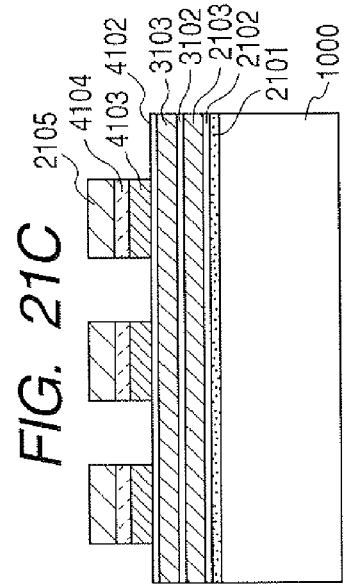

SEMICONDUCTOR MEMBER, SEMICONDUCTOR ARTICLE MANUFACTURING METHOD, AND LED ARRAY USING THE MANUFACTURING METHOD

This application is a divisional of application Ser. No. 12/442,902, which was the National Stage of International Application No. PCT/JP2007/071267, filed Oct. 25, 2007. The contents of each of the foregoing applications are incorporated herein by reference.

TECHNICAL FIELD

The present invention relates to a semiconductor member and a method of manufacturing a semiconductor. The present invention also relates to an optical device such as a light-emitting device, an LED array chip, an LED printer head, and an LED printer manufactured using such method.

BACKGROUND ART

There is known a technology in which a light-emitting diode forming layer formed via an etching sacrificial layer on a GaAs substrate is transferred onto a silicon substrate.

A technology where a light-emitting diode forming layer is transferred onto a silicon substrate is described in Japanese Patent Laid-Open Application No. 2005-012034.

More specifically, first, a groove for dividing a light-emitting diode forming layer formed via a sacrificial layer on a GaAs substrate into its respective light-emitting regions is provided. The sacrificial layer is exposed immediately below the groove.

Then, a dry film resist is bonded to the light-emitting diode forming layer. Further, a mesh support member formed of metal wire is bonded to the dry film resist.

After that, the resist except that located immediately below the metal wire is removed. Then, the sacrificial layer is etched by bringing an etchant into contact with the sacrificial layer via the mesh support member, whereby the GaAs substrate is separated from the bonded structure.

Further, after the GaAs substrate is separated, the light-emitting diode forming layer is bonded to a silicon substrate.

In this way, a light-emitting diode forming layer is transferred onto a silicon substrate.

DISCLOSURE OF THE INVENTION

However, the inventors of the present invention have come to recognize that, because the technology described in the above-mentioned Japanese Patent Laid-Open Application No. 2005-012034 requires a lot of bonding processes, when mass production thereof is considered, further contrivance is necessary.

The inventors of the present invention have come to think that, when the number of the bonding processes is decreased and the sacrificial layer is etched, it is desirable that the light-emitting diode forming layer be transferred onto the silicon substrate, and achieved the epoch-making present invention as described below.

An object of the present invention is as follows.

That is, an object of the present invention is to provide a novel manufacturing method and a novel member materialized by bonding processes whose number is as small as possible.

According to the present invention, there is provided a method of manufacturing a semiconductor article having a compound semiconductor multilayer film formed on a semiconductor substrate, including:

preparing a member including an etching sacrificial layer, a compound semiconductor multilayer film, an insulating film, and a semiconductor substrate provided on a compound semiconductor substrate in the stated order from the side of the compound semiconductor substrate, the member having a first groove provided in the compound semiconductor multilayer film and a second groove passing through the semiconductor substrate and being connected to the first groove; and bringing an etchant into contact with the etching sacrificial layer through the first groove and the second groove and thus etching the etching sacrificial layer to separate the compound semiconductor substrate from the member.

In this case, the member may be prepared by:

forming the etching sacrificial layer on the compound semiconductor substrate;

forming the compound semiconductor multilayer film on the etching sacrificial layer;

forming the first groove in the compound semiconductor multilayer film such that the etching sacrificial layer is exposed;

preparing the semiconductor substrate having the second groove and the insulating film; and bonding the compound semiconductor substrate to the semiconductor substrate such that the first groove and the second groove are connected to each other.

Alternatively, the member may be prepared by:

forming the etching sacrificial layer on the compound semiconductor substrate;

forming the compound semiconductor multilayer film on the etching sacrificial layer;

preparing the semiconductor substrate having the insulating film;

bonding the compound semiconductor substrate to the semiconductor substrate;

forming the second groove in the semiconductor substrate;

forming a third groove in the insulating film; and forming the first groove in the compound semiconductor multilayer film such that the etching sacrificial layer is exposed.

The semiconductor substrate may be provided with a driver circuit for driving a light-emitting diode structured to include the compound semiconductor multilayer film.

Further, according to a second aspect of the present invention, there is provided a method of manufacturing a semiconductor article formed by bonding a compound semiconductor substrate and a semiconductor substrate, comprising the steps of:

preparing the compound semiconductor substrate and the semiconductor substrate;

forming an etching stop layer, an etching sacrificial layer, a compound semiconductor multilayer film including an active layer, and a mirror layer on the compound semiconductor substrate in the stated order from the side of the compound semiconductor substrate;

providing a first groove in the compound semiconductor multilayer film such that the etching sacrificial layer is exposed to divide the compound semiconductor multilayer film in an island shape;

forming a second groove passing through the semiconductor substrate;

bonding the compound semiconductor substrate to the semiconductor substrate via an organic material film such that the second groove provided in the semiconductor substrate and the first groove are connected to each other to form a member;

bringing the etching sacrificial layer into contact with an etchant to separate the compound semiconductor substrate from the member; and forming a light-emitting device using the compound semiconductor multilayer film on the semiconductor substrate.

According to a third aspect of the present invention, there is provided an LED array manufactured using the method of manufacturing a semiconductor article described above.

An LED printer head may be configured by mounting a rod lens array on the LED array.

Further, according to another aspect of the present invention, there is provided an LED printer including the LED printer head, a photosensitive drum, and a charging unit, and an imaging unit for writing an electrostatic latent image on the photosensitive drum with the LED printer head being as a light source.

In particular, a color LED printer may be formed by including a plurality of the imaging units.

Further, according to a fourth aspect of the present invention, there is provided a semiconductor member having a compound semiconductor multilayer film formed on a semiconductor substrate, comprising an etching sacrificial layer, the semiconductor multilayer film, an insulating film and a silicon substrate formed on a compound semiconductor substrate in the stated order from the side of the compound semiconductor substrate, in which a groove for exposing the etching sacrificial layer is provided in the compound semiconductor multilayer film, and a passing-through groove being connected to the groove is provided in the semiconductor substrate and the insulating film.

Further, according to a fifth aspect of the present invention, there is provided a method of manufacturing a semiconductor article including a compound semiconductor multilayer film on a substrate, including:

preparing a member including an etching sacrificial layer, a compound semiconductor multilayer film and a second substrate provided on a first substrate in the stated order from the side of the first substrate, the member having a first groove provided onto the compound semiconductor multilayer film and a second groove provided passing through the second substrate and being connected to the first groove; and bringing an etchant into contact with the etching sacrificial layer through the first groove and the second groove and thus etching the etching sacrificial layer to separate the first substrate from the member.

Further, according to a sixth aspect of the present invention, there is provided a method of manufacturing a light-emitting device including:

forming a separation layer and a light-emitting layer on a first substrate in the stated order from the side of the first substrate;

bonding the first substrate to a second substrate such that the light-emitting layer is positioned inside to form a bonded member;

transferring the light-emitting layer onto the second substrate by etching and removing the separation layer, wherein a pair of the separation layer and the light-emitting layer on the first substrate is repeatedly deposited n times, the n being a natural number of two or more, only the uppermost light-emitting layer is patterned into a shape of a plurality of islands, and then the first substrate is bonded to the second substrate to form a bonded structure, and wherein an etchant is caused to penetrate into a space which is formed in the bonded structure by the island-shape patterning, thereby bringing the separation layer into contact with the etchant to selectively transfer the island-shaped light-emitting layer onto the second substrate.

Further, according to a seventh aspect of the present invention, there is provided a light-emitting device including a light-emitting device formed on a silicon substrate via a DBR mirror.

Further, according to an eighth aspect of the present invention, there is provided a semiconductor member, including a separation layer, a compound semiconductor multilayer film, an insulating film and a second substrate provided on a first substrate, in the stated order from the side of the first substrate, in which a groove for dividing the compound semiconductor multilayer film into a plurality of regions and for exposing the separation layer is provided in the compound semiconductor multilayer film, and a passing-through groove being connected to the groove is provided in the second substrate and the insulating film.

Further, according to a ninth aspect of the present invention, there is provided a method of manufacturing a semiconductor article having a compound semiconductor multilayer film formed on a semiconductor substrate, including:

preparing a member including a separation layer, a compound semiconductor multilayer film, and a second substrate provided on a first substrate in the stated order from the side of the first substrate, the member having a first groove provided in the compound semiconductor multilayer film and a second groove provided passing through the second substrate and being connected to the first groove; and separating the first substrate from the member.

Further, according to another aspect of the present invention, there is provided a method of manufacturing an LED array, including:

forming a separation layer, a light-emitting layer, and a DBR layer in the stated order on a surface of a first semiconductor substrate and bonding the substrate to a second substrate having a semiconductor circuit formed thereon via an insulating film;

transferring the light-emitting layer and the DBR layer of the first substrate onto the second substrate by etching and removing the separation layer;

making the transferred light-emitting layer into an array of a plurality of light-emitting portions; and electrically connecting the plurality of light-emitting portions with an electrode portion of the semiconductor circuit for controlling light emission of the light-emitting portions.

Further, according to another aspect of the present invention, in the first aspect of the invention, the island-shaped compound semiconductor multilayer film formed on the compound semiconductor substrate surrounded by the first groove has a rectangle shape having a long side and a short side, and a plurality of the second grooves passing through the semiconductor substrate are intermittently disposed in an array in parallel with the direction of the long side (longitudinal direction) thereof.

Further, according to another aspect of the present invention, in the first aspect of the invention, there is provided a method of manufacturing a semiconductor, after separating the compound semiconductor substrate from the member, an electrode is formed on the island-shaped compound semiconductor multilayer film via an insulating member to form a light-emitting device array chip having a long side direction and a short side direction, and the second substrate is cut in a direction of the long side so that second passing-through grooves in parallel with one another which are provided in the second substrate and are arranged in the direction of the short side are connected to each other.

Further, according to another aspect of the present invention, in the fifth aspect of the invention, the top view of the shape of the compound semiconductor multilayer film patterned in an island shape by the first groove is a rectangle having a long side direction and a short side direction, and a plurality of the second grooves passing through the second substrate is formed so as to be in parallel in the direction of the long side to thereby form a passing-through groove group in the direction of the long side, in which a plurality of the passing-through groove groups in the direction of the long side is arranged so as to be in parallel with one another at intervals which are equal to or longer than the length of the short side of the island-shaped compound semiconductor multilayer film.

Further, according to another aspect of the present invention, there is provided a bonded structure formed by bonding a first substrate and a second substrate; the first substrate including compound semiconductor multilayer film regions each patterned in an island shape on the first substrate via a separation layer, in which a first groove is provided between the compound semiconductor multilayer film regions and the top view of the shape of the compound semiconductor multilayer film regions is a rectangle having a direction of a long side and a direction of a short side; the second substrate including a second groove passing through the second substrate, in which a plurality of the second grooves are intermittently provided so as to be in parallel in the direction of the long side to thereby form a passing-through groove group in the direction of the long side, and a plurality of the passing-through groove groups in the direction of the long side are arranged so as to be in parallel with one another at intervals which are equal to or longer than the length of the short side of the island-shaped compound semiconductor multilayer film regions.

Further, according to another aspect of the present invention, a plurality of the LED array chips manufactured by the above-described method of manufacturing a semiconductor article are connected thereto and a rod array lens is not mounted.

It is to be noted that, in the above description, "in the stated order" means "in the stated order with regard to the listed structural element", and does not preclude a case where another layer is provided between the listed layers.

EFFECT OF THE INVENTION

According to the present invention, the number of bonding processes can be decreased compared with that of the technology described in Japanese Patent Laid-Open Application No. 2005-012034.

Further, with regard to the member formed by bonding the first substrate (for example, a compound semiconductor substrate) to the second substrate (for example, a silicon substrate), the etchant is brought into contact with the sacrificial layer through the passing-through groove formed in the second substrate.

Therefore, compared with a case where the etchant is made to penetrate in the direction of a surface of the substrate only from the most outer peripheral sides of the member, the time required for etching the sacrificial layer can be shortened.

Further features of the present invention will become apparent from the following description of exemplary embodiments with reference to the attached drawings.

BRIEF DESCRIPTION OF THE DRAWINGS

FIG. 18, FIG. 18A, and FIG. 18B are views illustrating the example of a method of manufacturing a semiconductor article according to the present invention.

FIG. 19 and FIG. 19A are views illustrating an example of a method of manufacturing a semiconductor article according to the present invention.

FIGS. 21A, 21B, 21C, 21D and 21E are views illustrating a process where a plurality of groups each comprised of a separation layer and a light-emitting layer are laminated on a first substrate.

Figure 1:
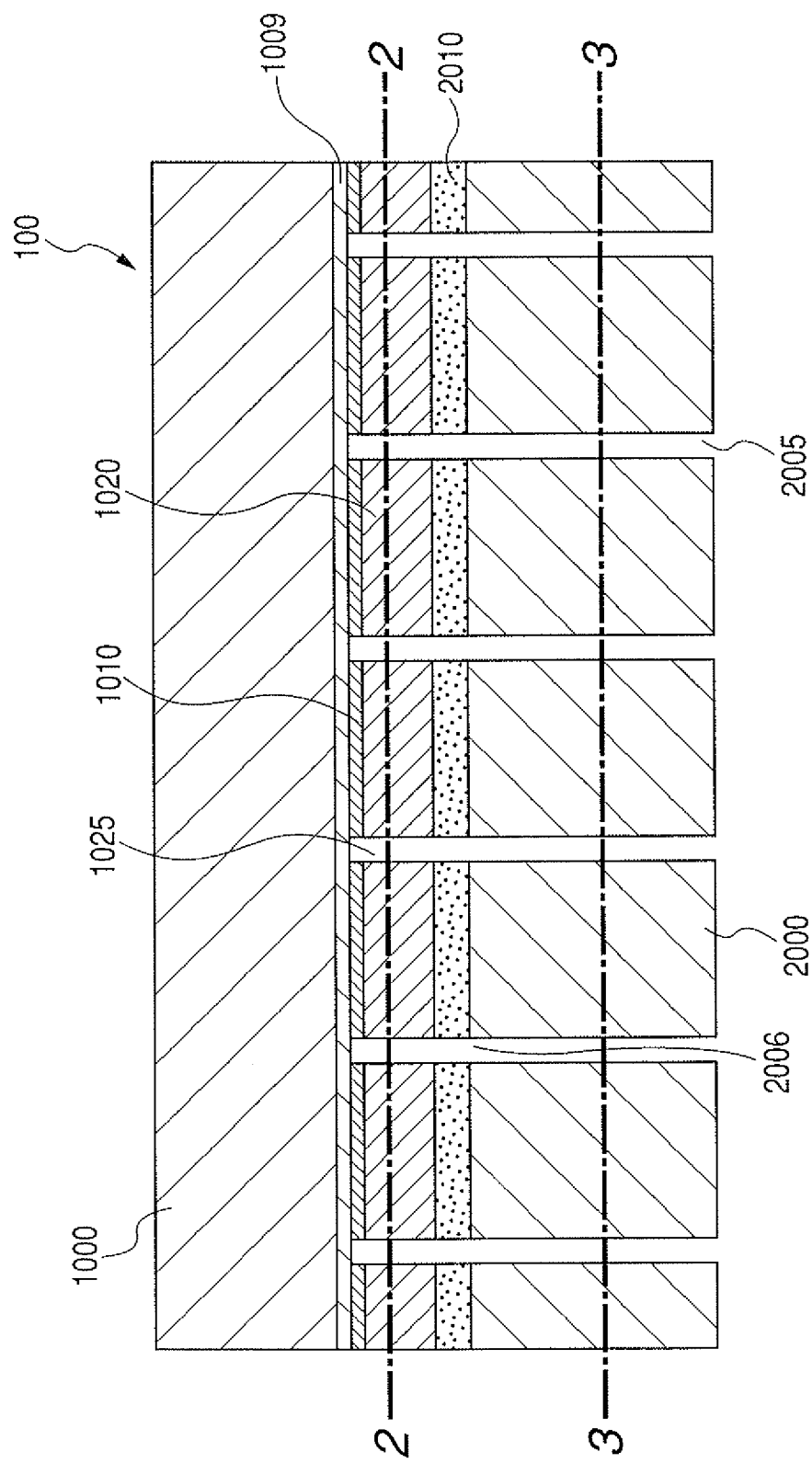
FIG. 1 is a sectional view of a member in connection with a method of manufacturing a semiconductor of a first embodiment according to the present invention.

It is to be noted that a reference numeral 1000 denotes a compound semiconductor substrate, a reference numeral 1009 denotes an etching stop layer, a reference numeral 1010 denotes an etching sacrificial layer, a reference numeral 1020 denotes a compound semiconductor multilayer film, a reference numeral 1025 denotes a first groove, and a reference numeral 2000 denotes, for example, a silicon substrate. Reference numerals 2005, 2006, and 2010 denote a second groove, a third groove, and an insulating film (organic material film), respectively.

BEST MODE FOR CARRYING OUT THE INVENTION

First Embodiment

The invention according to the present embodiment is now described with reference to FIGS. 1 to 3.

In FIG. 1, a reference numeral 1000 denotes a first substrate (a compound semiconductor substrate or a substrate formed of, for example, Ge). A reference numeral 1009 denotes an etching stop layer, a reference numeral 1010 denotes an etching sacrificial layer, and a reference numeral 1020 denotes a compound semiconductor multilayer film (here, details of the layer structure of the multilayer film are omitted). Further, a reference numeral 1025 denotes a first groove for dividing the compound semiconductor multilayer film 1020 so as to be in an island shape on the compound semiconductor substrate. A reference numeral 1009 denotes an etching stop layer provided as necessary. A reference numeral 100 denotes a member according to the present invention.

Reference numerals 2000, 2005, and 2010 denote a second substrate (for example, a silicon substrate), a second groove provided in the second substrate, and an insulating film (for example, an organic material film), respectively. The insulating film 2010 is also provided with a third groove 2006 connected to the second groove. Although, in the figure, the width and spacing of the first groove is shown equal to those of the second groove, the width of the first groove may be larger than that of the second groove. However, because it is necessary that the first groove 1025 and the semiconductor substrate groove 2005 as the second groove are connected to each other, it is desirable that the width of an island of the compound semiconductor layer (the length in the direction of a short side described in the following) is smaller than the spacing between grooves passing through the second substrate. Although, here, a silicon substrate is used as the second substrate, the second substrate is not limited specifically to a silicon substrate.

It is to be noted that, in FIG. 1, the width of the first groove 1025 is, for example, from several micrometers to several hundred micrometers. The width of the second groove 2005 is, for example, from several micrometers to several hundred micrometers. It is to be noted that, in order that an etchant easily penetrates from the second groove (passing-through groove), the width is preferably 50 µm or more, more preferably 100 µm or more, and still more preferably 200 µm or more. However, there are cases where the width depends on the thickness of the second substrate. It is to be noted that the width of an island of the compound semiconductor layer is preferably smaller than the spacing between grooves passing through the silicon substrate. Further, the insulating film 2010 may be omitted as appropriated.

Figure 2:
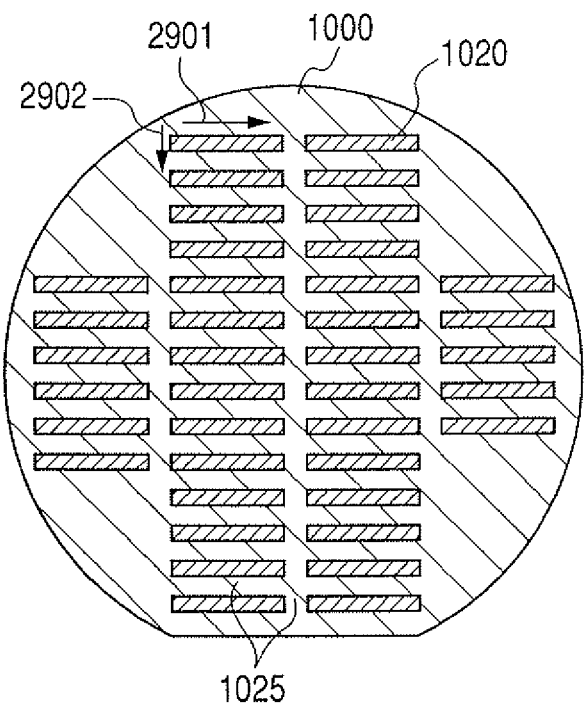
FIG. 2 is a view seen from below of a section 2-2 in FIG. 1.

FIG. 2 partially illustrates a section 2-2 in FIG. 1. As is clear from FIG. 2, the compound semiconductor multilayer film 1020 is divided (patterned) in an island shape on the first substrate 1000.

An island portion 1020 is in a projected form compared with portions surrounding it. Of course, it is enough that the compound semiconductor multilayer film 1020 is patterned in a desired shape, and it is not necessarily required to be in a rectangular island shape as illustrated in the figure. Further, hereinafter, the direction of a long side of a rectangular island is sometimes referred to a longitudinal direction while the direction of a short side is sometimes referred to as a traversal direction. It is to be noted that, in FIG. 2, like reference numerals designate like members in FIG. 1, and the same applies to drawings referred to in the following.

The first groove 1025 is a space (a gap) in the island-shaped compound semiconductor multilayer film 1020. It is to be noted that like reference numerals designate like structural members in FIG. 1.

Figure 3:
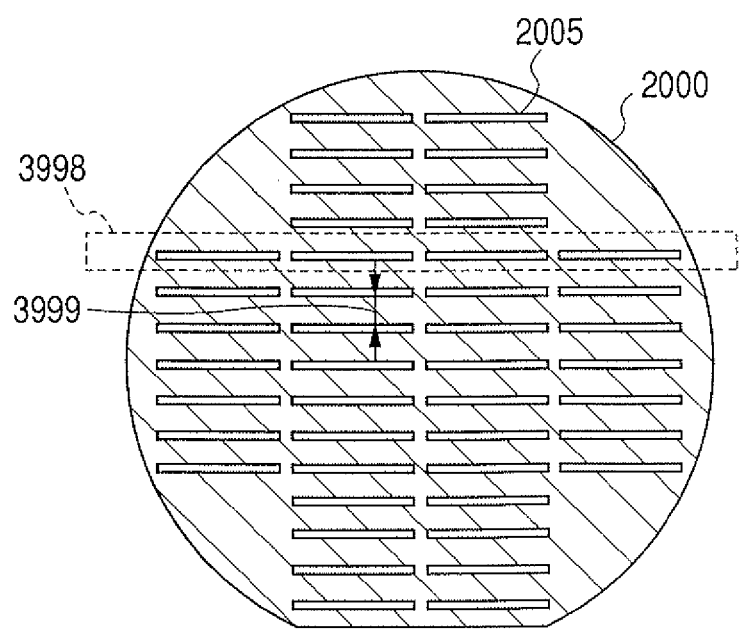
FIG. 3 is a view illustrating a section 3-3 in FIG. 1.

FIG. 3 illustrates a section 3-3 in FIG. 1. As is clear from FIG. 3, the second groove 2005 is provided in the second substrate 2000. It is to be noted that the second groove 2005 is intermittently formed. By intermittently providing the passing-through groove in this way, in the case of, for example, a silicon wafer, the stiffness thereof is not considerably lost, and thus, a situation that handling thereof in subsequent processes becomes difficult can be avoided.

Figure 12A:
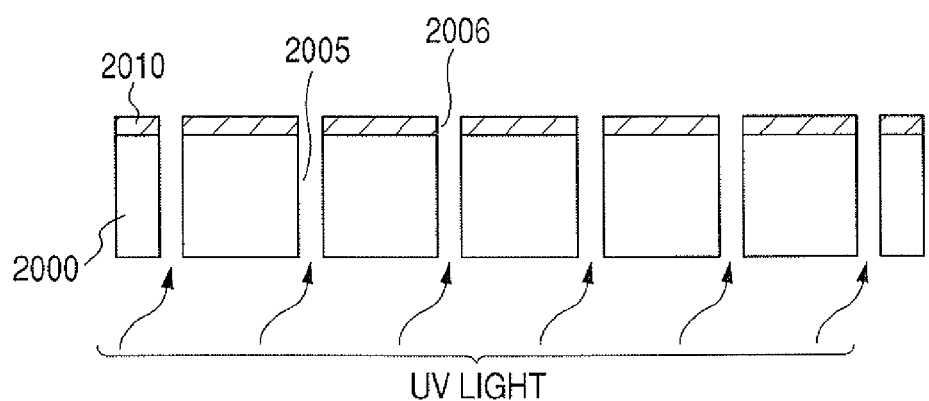
FIG. 12A and FIG. 12B are views illustrating the example of a method of manufacturing a semiconductor article according to the present invention.
Figure 12B:
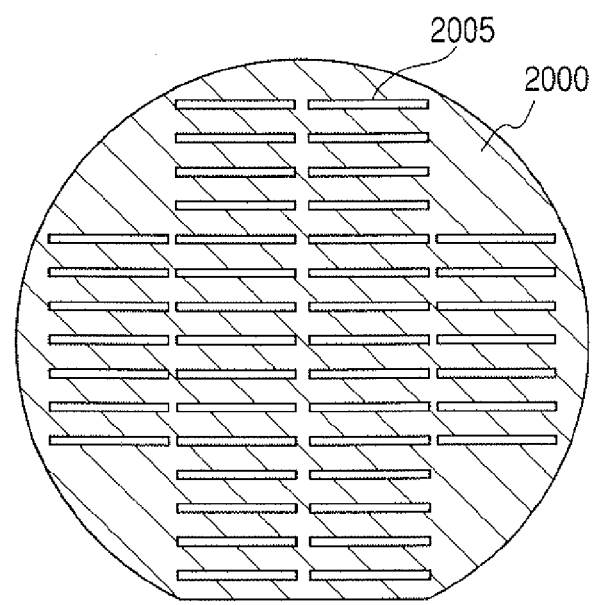

It is to be noted that, as illustrated in FIG. 12B, the passing-through groove is preferably formed separately (intermittently) with the longitudinal direction of the second groove (passing-through groove) being along a chip scribe line which is used when the wafer is separated into chips in a downstream process, taking into consideration the mechanical strength.

Figure 4:
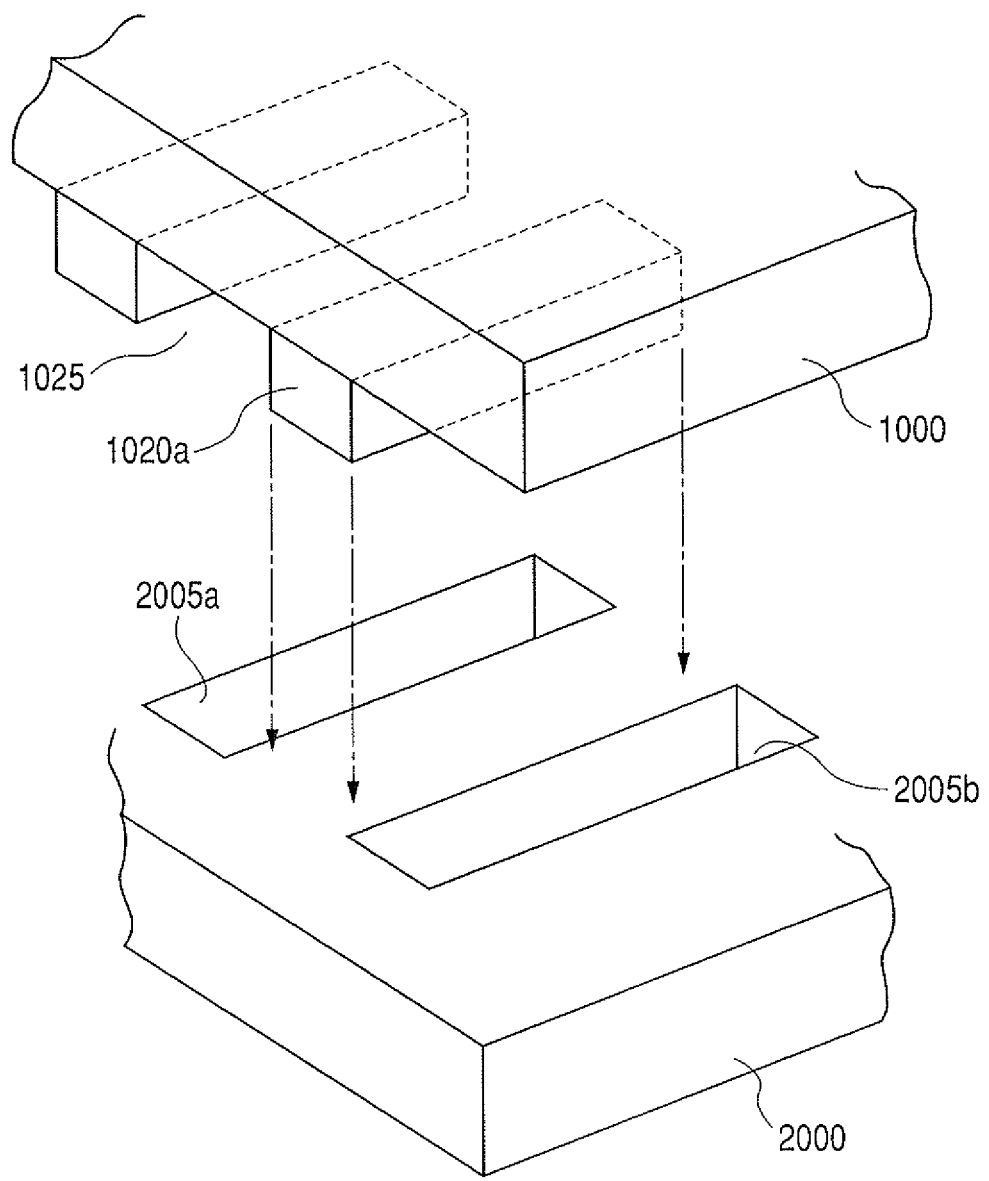
FIG. 4 is a partially exploded perspective view illustrating a positional relationship between a first groove and a semiconductor substrate groove and illustrating a state where an island-shaped compound semiconductor multilayer film is disposed between semiconductor substrate grooves.

FIG. 4 is a partially exploded perspective view illustrating a positional relationship between the first groove 1025 and a semiconductor substrate groove 2005 and illustrating a state where an island-shaped compound semiconductor multilayer film 1020 is disposed between the semiconductor substrate grooves 2005. It is to be noted that, in FIG. 4, the insulating film 2010, the etching stop layer 1009, and the etching sacrificial layer 1010 are omitted for the sake of simplification.

Further, it is preferable that, when FIG. 2 and FIG. 3 are superposed, an island 1020a in the projected form is located right between passing-through grooves 2005a and 2005b.

Of course, as long as the island 1020a in the projected form can be supported, the passing-through groove 2005 is not necessarily required to be provided so as to be located in parallel with the longitudinal direction of the patterned compound semiconductor multilayer film 1020 as illustrated in FIGS. 2 and 3. For example, (when seen from the top,) the passing-through groove 2005 may be provided so as to be perpendicular to or so as to intersect with the longitudinal direction. It is to be noted that the passing-through groove may also be referred to as a passing-through hole because it passes through the substrate.

The member 100 is prepared which is formed so as to include the first substrate (for example, a compound semiconductor substrate) 1000, the etching sacrificial layer 1010, the compound semiconductor multilayer film 1020, the insulating film (for example, an organic insulating material film) 2010, and the second substrate (for example, a silicon substrate) 2000.

The etching stop layer 1009 may be provided as necessary and is not essential.

Then, as illustrated in FIG. 1, an etchant is made to penetrate into the member through the second groove 2005 and the third groove 2006 which pass through the second substrate 2000 (for example, a silicon substrate) and the insulating film 2010, respectively.

By bringing the etchant into contact with the etching sacrificial layer 1010, etching is carried out to separate the first substrate 1000 from the member.

It is to be noted that, although, in FIG. 1, the first groove 1025 passes through the etching sacrificial layer 1010, the first groove 1025 is not required to pass through the etching sacrificial layer 1010. What is necessary is that the etching sacrificial layer can be exposed when or before the first substrate 1000 is removed from the member 100.

Further, the etching stop layer 1009 illustrated in FIG. 1 may be provided as necessary. When the extent of the etching is temporally strictly controlled, the etching stop layer is not necessarily required to be provided. However, this layer has the effect of uniformly exposing the etching sacrificial layer over the whole wafer.

(Member)

The member may be, for example, prepared according to the following two methods. Of course, as long as the member illustrated in FIG. 1 can be materialized, the present invention is not limited to the following two methods.

A first method is implemented so as to include the following steps A1) to E1):

A1) forming the etching sacrificial layer 1010 on the first substrate 1000 such as a compound semiconductor substrate by epitaxial growth;

B1) forming the compound semiconductor multilayer film 1020 on the etching sacrificial layer 1010;

C1) forming the first groove 1025 in the compound semiconductor multilayer film 1020 such that the etching sacrificial layer 1010 is exposed;

D1) preparing the second substrate 2000 which is provided with the second groove 2005 and has the insulating film 2010; and E1) bonding the first substrate 1000 to the second substrate 2000 such that the first groove 1025 and the second groove 2005 are connected to each other.

It is to be noted that, in the step C1 where the compound semiconductor multilayer film is divided in a desired patterned shape, the patterning is carried out such that, for example, as illustrated in FIG. 2, the island in the projected form remains. It is to be noted that, in C1, at least part of the surface of the etching sacrificial layer may be exposed, or, the first groove may extend in the direction of the etching sacrificial layer and the etching sacrificial layer immediately below the first groove may be completely removed. Further, regions below the etching sacrificial layer (for example, the first substrate, the etching stop layer, and/or a buffer layer) may be exposed. It is to be noted that the third groove may be provided after the step E1 which is a bonding process.

Further, as long as the member can be manufactured, the order of the above steps is not limited to the one specified in the above. For example, the step D1) may be carried out before the steps A1) to C1).

Still further, the controllability is further enhanced if the etching stop layer is epitaxially grown on the compound semiconductor substrate before the etching sacrificial layer is epitaxially grown. More specifically, the uniformity of the etching over the whole substrate is improved. Although the etching stop layer is formed as shown in FIG. 1, such layer is not essential for the present invention.

Further, preferably, the spacing of the second passing-through grooves 2005 formed in the second substrate 2000 such as a silicon substrate and the width of the compound semiconductor multilayer film separated in an island shape are substantially equal or the width of the compound semiconductor multilayer film is smaller.

Still further, it is to be noted that the second groove 2005 is formed by dry etching (RIE) or the like, for example, halfway in the depth direction of the second groove illustrated in FIG. 1 (in the figure, the depth direction is the upward direction), that is, such that the material forming the second substrate is partly left on the side of the insulating film 2010. The mask used in RIE is not specifically limited, and is, for example, SiN. After that, the first substrate 1000 is bonded to the second substrate. Then, the groove formed in the second substrate may be extended in the depth direction by wet etching or the like such that the groove passes through the second substrate 2000.

Of course, the second groove 2005 is formed by dry etching (RIE) or the like, for example, halfway in the depth direction of the second groove illustrated in FIG. 1 (in the figure, the depth direction is the leftward direction), that is, such that the material forming the second substrate is partly left on the side of the insulating film 2010. Then, after the groove formed in the second substrate is extended by wet etching or the like such that the groove passes through the second substrate 2000, the first substrate 1000 may be bonded to the second substrate.

Although, in the process D1 described in the above, the insulating film 2010 is provided on the second substrate, it is also acceptable that, after the insulating film is provided on the compound semiconductor multilayer film 1020 which is patterned in a desired shape, it is bonded to the second substrate. Of course, when the second substrate is a silicon substrate or a substrate having a silicon region, an oxide layer formed on the surface may be used as the insulating film. It is to be noted that the insulating film 2010 disposed in the member 100 may be provided in advance on the side of the first substrate, on the side of the second substrate, or on the side of both the first and the second substrates. It is to be noted that the insulating film 2010 may be omitted when, for example, the second substrate is an insulating substrate such as a quartz and glass substrate.

A second method of preparing the member is carried out according to the following steps:

A2) forming the etching sacrificial layer 1010 on the first substrate 1000;

B2) forming the compound semiconductor multilayer film 1020 on the etching sacrificial layer 1010;

C2) preparing the second substrate 2000 which has the insulating film 2010;

D2) bonding the first substrate 1000 to the second substrate 2000;

E2) forming the second groove 2005 in the silicon substrate 2000;

F2) forming the third groove 2006 in the insulating film 2010 after the second groove 2005 is formed; and G2) forming the first groove 1025 in the compound semiconductor multilayer film 1020 such that the etching sacrificial layer 1010 is exposed.

It is to be noted that the second groove 2005 is formed by dry etching (RIE) or the like, for example, halfway in the depth direction of the second groove illustrated in FIG. 1 (in the figure, the depth direction is the leftward direction), that is, such that the material forming the second substrate is partly left on the side of the insulating film 2010. After that, the groove may be made to pass through the second substrate 2000 by wet etching.

Although exemplary methods of materializing the member illustrated in FIG. 1 are described in the above, the present invention does not exclude presence of another layer, film, or region between the structural substrates, structural layers, or structural films, or does not exclude film formation or bonding which includes such presence. For example, a metal film may be partly or wholly provided between the insulating film 2010 and the second substrate 2000, and a wiring region or a circuit region may be provided on the second substrate or may be provided using the second substrate and the insulating film. The circuit region referred to herein is a driving circuit or a switching circuit when a light-emitting device or a light-receiving device is manufactured using the compound semiconductor multilayer film, or a circuit including wiring just for energization or voltage application.

(Second Substrate)

The second substrate 2000 includes, for example, a semiconductor substrate, a silicon substrate, a silicon wafer having an oxide layer formed on the surface thereof, and a silicon wafer having a desired electric circuit (for example, a driver) provided thereon. A silicon substrate having an insulating film as illustrated in FIG. 1 is formed, for example, as in the following.

After an organic material film as an insulating film is formed on one surface of the silicon substrate, a mask layer for forming the second groove 2005 as a semiconductor substrate groove is formed on the other surface using a resist, and the semiconductor substrate groove 2005 is formed in the silicon substrate using the mask. Dry etching such as RIE or wet etching may be used. A sandblaster for forming a groove by causing quartz particles or the like to collide with the exposed portions to physically break the silicon substrate may also be used. Of course, combinations thereof may also be used. For example, a groove may be formed to some extent in the depth direction by RIE or a sandblaster, and after that, a passing-through hole may be formed in the first substrate formed of silicon or the like by wet etching before (or after) bonding to the first substrate. Alternatively, the groove may also be exposed by grinding or abrasion from the rear surface of the first substrate.

The following is another example. First, the second groove 2005 which passes through the silicon substrate is formed. Then, an organic material film (for example, a positive type photosensitive polyimide film) is applied on one surface, and UV light is applied from the side of the other surface with the silicon substrate being the mask. Then, only the portion of the organic material film located above the second groove 2005 is developed and removed. Of course, the step of exposing the organic material film by using the silicon substrate having the passing-through groove therethrough as the mask and removing the exposed organic material film may be carried out with the first substrate being bonded to the silicon substrate. It is to be noted that, after the bonding process, UV light may be applied from the side of the second substrate and the organic material film immediately above the second groove may be removed to form the third groove.

Advantages of applying this method in forming the groove in the second substrate are as follows.

Because it is not a device process but a resist shaping for forming the groove on the silicon substrate, it is a first layer formation which does not require mask alignment. Further, because the size of the groove is several hundred microns or more, which is relatively large, degassing of the resist is not necessary. Therefore, an inexpensive apparatus with great productivity which does not require a pressure reducing mechanism can be used.

It is to be noted that the method of manufacturing the passing-through grooves formed in the silicon substrate and in the insulating film is not specifically limited, and imprinting using a mold (stamper) having a predetermined pattern may also be used.

It is to be noted that formation of an anisotropic groove in a silicon substrate is described in, for example, a document by Ayon, et al. (Sensors and Actuators A91 (2001) 381-385)

This makes it possible to, for example, form a passing-through groove by deep RIE in a silicon wafer as thick as several hundred microns with side walls being protected and without making worse the aspect ratio. Further, the passing-through groove may be formed not by chemical etching but by fluid energy or by causing solid particles to collide such as sandblasting.

Further, a driver circuit may be provided in the silicon substrate 2000. The driver circuit referred to herein is, for example, a circuit for driving and controlling the LED, when a light-emitting diode (LED) is formed so as to include the compound semiconductor multilayer film.

It is to be noted that the silicon substrate, a so-called CZ wafer, may be, of course, a substrate having an epitaxial silicon layer on the surface thereof. Further, instead of the silicon substrate, an SOI substrate may be used.

It is to be noted that, in order that an etchant (for removing the etching sacrificial layer) easily causes penetration through the passing-through groove of the second substrate such as a silicon substrate, the surface of side walls of the passing-through groove in the silicon substrate may be treated using ozone asking or a piranha solution which is a mixture of sulfuric acid and hydrogen peroxide.

Further, when the first substrate is bonded to the second substrate such as a silicon substrate, a metal film may exist therebetween or between the insulating film on the silicon substrate and the first substrate. It can function as a reflection layer when an LED device is manufactured. Of course, a DBR mirror may be used instead of the metal film. It is to be noted that, in order to make the metal film (for example, Ti, Au, or Pt) function as a reflective mirror, it may also be provided between the insulating film and the second substrate (for example, silicon). It is to be noted that when a DBR, that is, a so-called Bragg Reflector is used, the DBR layer is disposed between the compound semiconductor multilayer film 1020 and the insulating film 2010.

As the second substrate, other than the silicon substrate, a glass substrate, a quartz substrate, a metal substrate, a ceramic substrate, a substrate coated with an insulating film, or the like may be applied. Although the thickness of the second substrate is not specified, such a thickness as 525 μm (4 inches), 625 μm (6 inches), 725 μm (8 inches), or 775 μm (12 inches) may be used. The thickness of the second substrate is, for example, in the range of 300 μm to 1000 μm, and, from the viewpoint of securing the strength and from the process viewpoint, preferably in the range of 400 μm to 800 μm.

It is to be noted that the passing-through groove (passing-through hole) in the second substrate may be a rectangular slit, or may be slits which are intermittently disposed at specified intervals as illustrated in FIG. 3.

Still further, Die Bonding Film (Hitachi Chemical Co., Ltd.) may be used to bond the first substrate to the second substrate. For example, the Die Bonding Film manufactured by Hitachi Chemical Co., Ltd. which functions both as a dicing tape and a die bonding film is bonded onto the second substrate such as a silicon substrate to improve the handleability. After that, alignment and the like are performed. In bonding, the dicing tape is removed (for example, removed by UV light application) and bonding to the side of the first substrate is performed. It is to be noted that, when the die bonding film remains on the second groove which passes through the second substrate, it is removed by etching or the like and coupling to the first groove is performed.

It is to be noted that the passing-through grooves formed in the second substrate are preferably a plurality of passing-through grooves in the shape of rectangles (strips) having a long side and a short side or of quadrilaterals which are intermittently provided. In particular, it is preferable that the plurality of passing-through grooves are aligned (in arrays) and intermittently disposed in the direction of the long side (in the longitudinal direction) of the passing-through grooves. Here, "intermittently" means that there is a gap between the grooves, that is, the grooves are separated. This is preferable also from the viewpoint of securing the strength of the substrate which is important when the substrate is introduced into a subsequent device process. The width of the gap is, for example, in the range of several micrometers to several hundred micrometers.

Further, it is preferable that the grooves which are intermittently provided in arrays are provided such that the grooves in the arrays are in parallel with one another as illustrated in FIG. 3.

(First Substrate)

As the first substrate 1000, a GaAs substrate, a p-type GaAs substrate, an n-type GaAs substrate, an InP substrate, an SiC substrate, a GaN substrate, or the like may be applied. It is to be noted that, other than a compound semiconductor substrate, a sapphire substrate or a Ge substrate may be used. A compound semiconductor substrate such as a GaAs substrate or a GaN substrate is preferable.

(Etching Sacrificial Layer)

The etching sacrificial layer referred to here is a layer which is etched faster than the compound semiconductor multilayer film, and it can be also referred to as a separation layer. The etching rate ratio of the etching sacrificial layer to the multilayer film thereon is five or more, preferably ten or more, and more preferably 100 or more.

The etching sacrificial layer is, for example, an AlAs layer or an AlGaAs layer (for example, $Al_{0.7}Ga_{0.3}As$).

When the AlGaAs layer is expressed as $Al_xGa_{x-1}As$ ($1 \geq x \geq 0.7$), the etching selectivity becomes remarkable when x is 0.7 or more. When an AlAs layer is used as the etching sacrificial layer, a diluted solution of 2-10% HF may be used as the etchant. The etchant is, for example, 10% hydrofluoric acid.

It is to be noted that a sapphire substrate may be used as the first substrate and a metal nitride film such as chromium nitride (CrN) may be used as the etching sacrificial layer thereon. A multilayer film as a functional layer for materializing a device (an LED or a laser) for blue or UV light is epitaxially grown on the chromium nitride. With regard to the multilayer film, GaInN as an active layer and, further, AlGaN or GaN as a spacer layer may be used.

It is to be noted that, as the etchant of the sacrificial layer, a common Cr etchant (a chromium etchant) may be used. Such an etchant is supplied by Mitsubishi Chemical Corporation.

(Manufacture of Passing-Through Groove in Second Substrate)

When the second substrate is a silicon substrate, the passing-through groove may be manufactured by RIE (reactive ion etching) using fluorine under an atmosphere of $SF_6$ or the like. Of course, the radical species is not limited to fluorine. When wet etching is carried out, NaOH, KOH, TMAH, or the like may be used.

It is to be noted that, in the present invention, as long as the etchant can be brought into contact with the sacrificial layer under the bonded state as illustrated in FIG. 1, the etching sacrificial layer may be exposed at any point of time.

The passing-through groove may be formed in the silicon substrate by RIE (reactive ion etching). When wet etching is carried out, a mixture of an oxidant such as $HNO_3$ and a hydrogen fluoride solution may be used as the etchant using the fact that a silicon oxide is dissolved in hydrofluoric acid. $CH_3COOH$, $Br_2$, or the like is used as an additive (Multiple Epitaxial Layer).

The etching sacrificial layer 1010 and the compound semiconductor multilayer film 1020 may be alternately repeatedly laminated on the first substrate 1000. In such a case, the compound semiconductor multilayer film can be repeatedly transferred onto the silicon substrate. Of course, the etching stop layer 1009, the etching sacrificial layer 1010, and the compound semiconductor multilayer film 1020 may also be alternately repeatedly laminated. Further, the alternate and repeated lamination on the first substrate in advance can avoid a plurality of times of thermal hysteresis for the epitaxial growth on the substrate even when the transfer of a pair of a sacrificial layer and a multi-layer 1020 is carried out a plurality of times one by one, which is preferable. The plurality of times of uses of the substrate is expected to have remarkable economic effects, because, generally speaking, a compound semiconductor substrate is ten times or more as expensive as silicon.

(Compound Semiconductor Multilayer Film)

The layer structure and material of the compound semiconductor multilayer film depend on what device is provided as a semiconductor article. Exemplary semiconductor articles as light-emitting devices include a light-emitting diode device (an LED device), a light-emitting laser diode (an LD device), and a light-receiving device.

For example, when an LED device is provided as a semiconductor article, the layer structure uses the following materials.

A p-AlAs layer (an etching sacrificial layer) is formed on a p-type GaAs substrate, and the following layers are provided thereon as the compound semiconductor multilayer film.

A p-type GaAs contact layer, a p-type AlGaAs clad layer, a p-type AlGaAs active layer, an n-type AlGaAs clad layer, and an n-type GaAs contact layer are provided.

It is to be noted that, as the etching stop layer, GaInP may be used between the sacrificial layer and the compound semiconductor substrate.

When the GaAs layer and the AlGaAs layer are etched with sulfuric acid, the etching is stopped by the GaInP layer. After that, the GaInP layer is removed by hydrochloric acid. When the GaAs layer and the AlGaAs layer are etched with ammonia peroxide mixture, AlAs is desirable as the stop layer.

Further, as the material of the compound semiconductor multilayer film, compound semiconductor materials other than GaAs, for example, AlGaInP type, InGaAsP type, GaN type, AlGaN type, and InAlGaN type can be applied to the present embodiment.

Further, at least one of a metal film and a DBR mirror may be provided between the compound semiconductor multilayer film 1020 and the insulating film 2010 formed of the organic material or the like.

Here, the metal film is formed of, for example, Au, Ag, Ti, Al, or AlSi, or a multilayer film formed of these materials. A preferable metal film material is selected according to a wavelength of light to be emitted by the LED. For example, when a red LED of 700-800 nm is to be manufactured, Au, Ag, or the like has a high reflectance. In case of a blue LED of about 360 nm, Al is preferable.

A DBR mirror (Bragg Reflector) is formed by, when it is for a GaAs compound semiconductor material, alternately laminating an AlAs layer and an AlGaAs layer a plurality of times or alternately laminating an Al oxide layer and an $Al_{0.2}Ga_{0.8}As$ layer. Because it is difficult to form an aluminum oxide by epitaxial growth, actually, it is preferable to control the index of refraction by, for example, alternately switching the value of x between 0.2 and 0.8 in $Al_xGa_{1-x}As$. Of course, by making higher the composition ratio of Al in the layer on the side of the lower index of refraction and by its oxidation after the lamination, Al oxide may be formed.

Further, when an LED device is formed using the compound semiconductor multilayer film, instead of a heterojunction LED, a homojunction LED as described in Japanese Patent Laid-Open Application No. 2005-012034 may be formed. In this case, after forming the respective layers by epitaxial growth, an impurity is diffused by solid phase diffusion to form a pn junction in the active layer.

It is to be noted that, in order that the contact layer forms an ohmic contact with a p-type electrode or an n-type electrode, an impurity concentration which is higher than that of the clad layers sandwiching the active layer is preferable.

It is to be noted that, in FIG. 1, the details of the layer structure of the compound semiconductor multilayer film are omitted.

It is preferable that the spacing of patterned island-shaped regions on the first substrate in the direction of the long side of the rectangular shape (spacing between islands along the direction of the long side) substantially corresponds to the spacing for dicing in a subsequent process. It is to be noted that a reference numeral 2901 in FIG. 2 denotes the direction of the long side while a reference numeral 2902 denotes the direction of the short side.

It is to be noted that, after the etching sacrificial layer is removed from the member, further device separation may be carried out such that dot-like light emitting points are formed in the compound semiconductor multilayer film using a mask or the like.

(Insulating Film)

The insulating film 2010 according to the present embodiment of the invention is, for example, a film formed of an organic material. A film formed of an organic material is, for example, a polyimide or other organic insulating film, or an insulating film. In this way, a film formed of an organic material includes an organic insulating film such as polyimide. More specifically, the insulating film is formed of a positive type photosensitive polyimide. Of course, after the exposure, the exposed portion substantially does not have further photosensitivity. It is to be noted that not only a positive type photosensitive polyimide but also a negative type photosensitive polyimide and even a nonphotosensitive polyimide can be applied to the present invention as long as a third passing-through groove can be formed using another mask or the like. It is to be noted that such a polyimide is supplied by, for example, HD Micro Systems, Ltd.

Japanese Patent Laid-Open Application No. 2005-012034 describes in detail a photosensitive polyimide. More specifically, an aromatic anhydride reacts with an alcohol having a double bond (for example, hydroxyethyl methacrylate) to form a dicarboxylic acid, which reacts with a diamine to form a polyamide having a double bond on a side chain thereof. This corresponds to a structure where a carboxyl group of a polyamic acid is substituted by a structure having a polymerizable double bond. A solution where the polymer is dissolved in a polar solvent such as NMP (n-methylpyrrolidone) together with a photoinitiator, a sensitizer, an adhesive aid, and the like is the photosensitive polyimide.

It is to be noted that a photosensitive or nonphotosensitive polyimide may be used as the polyimide.

Further, other organic material films can be used for bonding the compound semiconductor substrate to the silicon substrate. Other than the above-described polyimides, an epoxy adhesive layer or the like can be adopted.

By covering the passing-through groove with the photosensitive organic material film and then applying UV light through the passing-through groove, the organic insulating layer above the passing-through groove in the silicon can be removed in a self-aligning manner.

Further, as the insulating film, not only the organic material film described in the above but also an inorganic insulating oxide film such as a silicon oxide film may be used. Further, a siloxane resin or the like may also be used.

It is to be noted that, when, for example, there is a circuit region using the space on and/or inside the silicon substrate as the second substrate, spin on glass (SOG) may be used to form a silicon oxide insulating film in order to enhance the planarity of the circuit region. Of course, a plurality of kinds of insulating films may be laminated to be used.

Further, the insulating film may be formed using an organic material such as a polyimide. In particular, carrying out bonding to the first substrate with enhanced adhesion through applying an organic material by spin coating, prebaking to volatilize the solvent, and then enhancing the adhesion ability is effective from the productivity viewpoint.

Further, in the member illustrated in FIG. 1, the insulating film may be omitted as necessary. Further, the insulating film may be formed of a plurality of layers. An insulating film may be provided on each of the side of the first substrate and the side of the second substrate for bonding, or, the insulating film may be provided on the side of only one of the substrates.

It is to be noted that, when a driving circuit or the like is provided on or inside the silicon substrate as the second substrate, it is preferable to provide the insulating film 2010. However, according to the present invention, the insulating film 2010 may be omitted.

Further, in the present invention, a photosensitive polymer sheet may be used as the insulating film. More preferably, the polymer sheet as itself has adhesion ability. It is to be noted that, when the insulating film is formed on the second substrate or when the insulating film is formed on the side of the first substrate, it may be formed after heating and pressure-bonding processes. Of course, a dilute organic material (photosensitive polyimide or the like) may be formed into a film by spin coating. Or, a photosensitive polyimide sheet which is a photosensitive polyimide formed to be sheet-like such as a dry film may be used.

(Exemplary Semiconductor Article Manufacturing Method)

An exemplary semiconductor article manufacturing method is described in the following. More specifically, the method is implemented so as to include the following steps:

1) preparing a compound semiconductor substrate (first substrate) and a silicon substrate (second substrate);

2) forming on the compound semiconductor substrate an etching stop layer, an etching sacrificial layer, a compound semiconductor multilayer film including an active layer, and a mirror layer in the stated order from the side of the compound semiconductor substrate (it is to be noted that the etching stop layer may be used as necessary and is not an essential layer for the present invention);

3) providing a first groove in the compound semiconductor multilayer film such that the etching sacrificial layer is exposed to divide the compound semiconductor multilayer film in an island shape;

4) forming a second groove so as to pass through the silicon substrate;

5) bonding the compound semiconductor substrate to the silicon substrate to form a bonded member such that the second groove provided in the silicon substrate having an organic material film on the surface thereof and the first groove are connected to each other;

6) bringing the etching sacrificial layer into contact with an etchant through the first and second grooves to separate the compound semiconductor substrate from the member; and 7) forming an LED device using the compound semiconductor multilayer film on the silicon substrate.

The manufacturing method is described in detail in an example described in the following. It is to be noted that, in the process 2), the present invention does not exclude inclusion of a layer other than the described layers, and presence of a material other than the layers and films described in the above is of course within the scope of the present invention.

Further, the member formed by the bonding according to the present invention has the following characteristics.

A semiconductor member having a compound semiconductor multilayer film on a silicon substrate includes an AlAs layer, a compound semiconductor multilayer film, an organic insulating film, and a silicon substrate on the compound semiconductor substrate in the stated order from the side of the compound semiconductor substrate, the compound semiconductor multilayer film being provided with a first groove such that the sacrificial layer is exposed, and the silicon substrate and the organic material film being provided with a second groove connected to the first groove.

(Others)

It is to be noted that, when the first groove 1020 and the second groove 2005 are deep, bubbles of gas (hydrogen) generated by etching the etching sacrificial layer formed of AlAs or the like may block an exit of the grooves. In such a case, it is preferable to continuously or intermittently apply ultrasound (intermittent application is also applicable) to a solution for the etching and to a wafer such as a compound semiconductor substrate. Further, it is also preferable to add alcohol to the etchant (for example, to the hydrofluoric acid).

(Mirror Layer)

Figure 7:
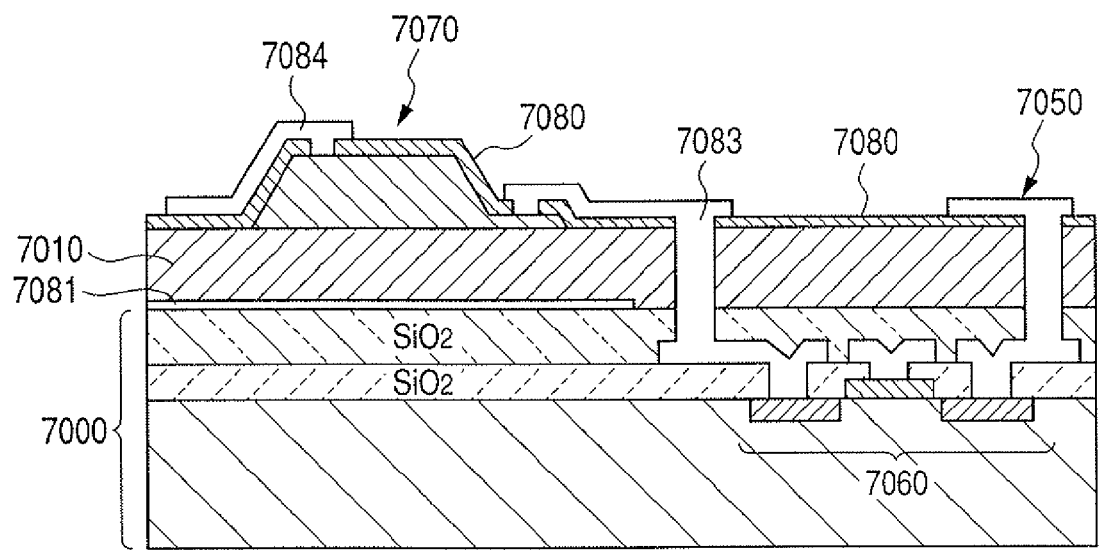
FIG. 7 is a sectional view illustrating a state where a driver circuit is built directly on the side of an Si substrate and is connected to an LED device.

At least one of a metal film or a DBR mirror may be provided between the compound semiconductor light-emitting layer and the insulating film such as an organic material film. It is to be noted that, when the mirror is a mirror formed of Ti, Au, Pt, AlSi, or the like, the mirror may be between the organic material film and the second substrate as illustrated in, for example, FIG. 7. In FIG. 7, a reference numeral 7010 denotes an insulating layer and a reference numeral 7081 denotes a mirror and the details are described in the following.

Figure 20:
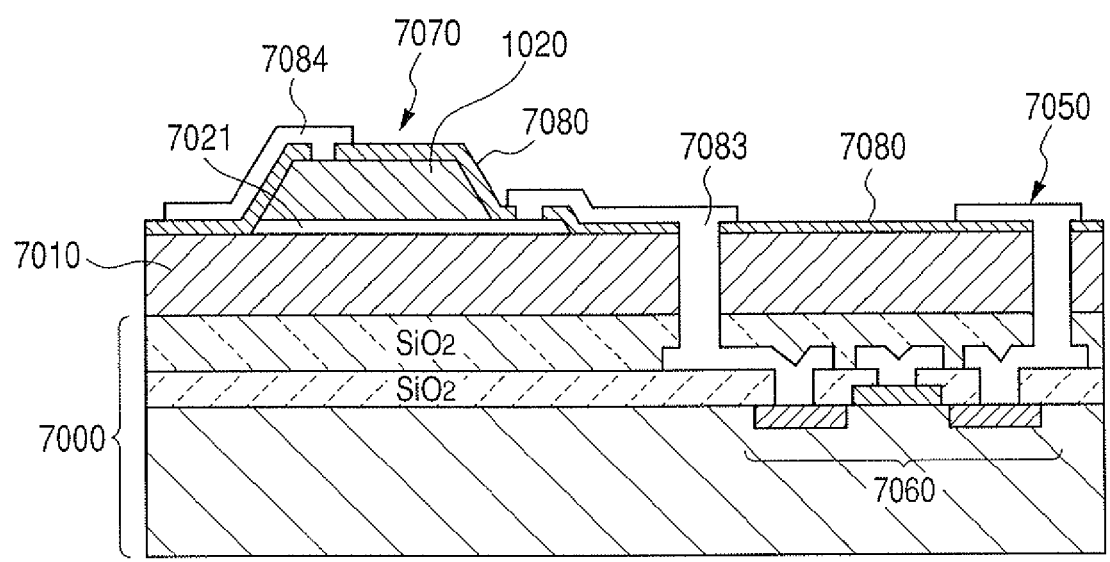
FIG. 20 is a sectional view illustrating a state where a driver circuit is built directly on the side of an Si substrate and is connected to an LED device.

Here, the DBR mirror may be continuously epitaxially grown on the compound semiconductor layer which is epitaxially grown. In such a case, a reference numeral 7021 in FIG. 20 is the mirror layer. The details are described in the following. A metal mirror may be formed by deposition above the grown compound semiconductor multilayer film, may be formed by deposition above the organic insulating layer, or the both may be simultaneously formed.

The DBR as the mirror is described in detail in the following.

The DBR layer forms a light-emitting layer which is formed on the first substrate via the etching sacrificial layer (separation layer) so as to include the active layer.

Here, the first substrate is a substrate for forming an LED (a light-emitting diode). Here, a substrate on which a compound semiconductor film for an LED can be grown is used. Exemplary materials for the first substrate include, when an III-V compound which is basically GaAs is grown, a GaAs substrate and a Ge substrate the lattice constant of which is close to that of GaAs. In the case of a GaAs substrate, the substrate may include Al, P, or the like which are elements of the same group. Further, according to the structure of the device, an impurity for forming a p-type or an n-type may be included.

The sacrificial layer, the light-emitting layer, and the DBR layer are epitaxially grown on the first substrate in sequence by MOCVD, MBE, or the like. Here, the sacrificial layer is a layer formed of a material which can be selectively etched in relation to the light-emitting layer, and is formed of, for example, AlAs or $Al_xGa_{1-x}As$ ($1 \geq x \geq 0.7$). The sacrificial layer of such composition is selectively etched with a hydrofluoric acid solution.

The light-emitting layer is formed of a compound semiconductor layer which functions as a light-emitting device, and, for example, GaAs, AlGaAs, InGaAs, GaP, InGaP, AlInGaP, and the like can be used. There is a pn junction in the layer. Further, as a specific structure, the light-emitting layer 1102 is formed of, for example, an active layer sandwiched between clad layers.

The DBR layer can be epitaxially grown on the first substrate, and has a structure where a plurality of pairs each having layers of different indices of refraction with regard to the target LED wavelength are laminated.

Each of the pairs is formed of a high refractive index layer and a low refractive index layer. That formed by laminating the pair a plurality of times is referred to as a Bragg reflector film or a DBR mirror (DBR layer).

The Bragg reflector film obtains a reflectivity which corresponds to the number m of the pairs by setting the film thicknesses d1 and d2 of the two kinds of films having different indices of refraction such that the optical film thickness n×d is ¼ of the wavelength and preparing m pairs of the two kinds of films (m is a natural number which is equal to or larger than two). In that case, the larger the difference between the indices of refraction of the layers forming the Bragg reflector film is, the higher the obtained reflectivity is, even if the number of the pairs is small. It is to be noted that, in the present invention, it is preferable that the conditions for forming the DBR are optimized such that a light of a specific wavelength can be reflected with the efficiency of 70% or more, preferably 80% or more, and more preferably 90% or more.

For example, the DBR layer is obtained by alternately laminating AlGaAs layers containing different amount of Al. Here, when the etching sacrificial layer is selectively removed, in order to suppress damage to the DBR layer, it is preferable that the amount x of Al which is contained in the layer is 0.8 or less when the material is expressed as $Al_xGa_{1-x}As$. The amount x is preferably 0.7 or less, more preferably 0.6 or less, and still more preferably 0.4 or less. The lower limit of x is, for example, zero.

In any case, the low refractive index layer which forms the DBR layer and the index of refraction of which is lower than the other layer is selected from the group consisting of $Al_xGa_{1-x}As$ ($0 \leq x \leq 0.8$), an AlInGaP type material, and an AlGaP type material. It is important that the etching sacrificial layer is selected from the group consisting of AlAs and $Al_xGa_{1-x}As$ ($0.7 \leq x \leq 1.0$) and the combination of the materials is such that the low refractive index layer is resistant to damage when the separation layer is selectively etched and removed. It is to be noted that, when an AlAs layer is selected as the sacrificial layer and an AlInGaP type material or an AlGaP type material is used as the low refractive index layer, the separation layer may be selectively removed without greatly depending on the amount of Al contained.

It is to be noted that, with regard to the structure of the DBR layer, the following three examples of combination of (high refractive index layer/low refractive index layer) are listed as DBR structures having high resistance to hydrofluoric acid:

1) $Al_{0.6}Ga_{0.4}As/Al_{0.2}Ga_{0.8}As$
2) $AlInGaP/Al_{0.2}Ga_{0.8}As$
3) $AlGaP/Al_{0.2}Ga_{0.8}As$

It is to be noted that, when a laser (LD) is manufactured, because a reflectivity of 99.9% or more is required, it is necessary to form 30 layers, 40 layers, or more of the pair. However, in the case of an LED where a reflectivity of 90% or more is satisfactory, several layers to about ten layers are satisfactory.

For example, a p-AlAs layer as a separation layer of a thickness of 100 nm, a light-emitting layer of a thickness of about 2000 nm, and an n-DBR layer are grown on a 4-inch GaAs substrate 100 by MOCVD. The details of the light-emitting layer are as follows. It is formed of p-$Al_{0.4}Ga_{0.6}As$: 350 nm as a clad layer, p-$Al_{0.13}Ga_{0.87}As$: 300 nm as an active layer, and n-$Al_{0.23}Ga_{0.77}As$: 1300 nm to be a clad located on the side of the DBR layer. With regard to the details of the n-DBR layer, it can be formed by laminating 20 pairs of $Al_{0.2}Ga_{0.8}As$: 633 Å/$Al_{0.8}Ga_{0.2}As$: 565 Å. It is to be noted that, by making lower the resistivity of the materials forming the DBR, electrical connection can be secured from the DBR mirror denoted as 7021 in FIG. 20.

Of course, a structure where the DBR is provided on both sides of the active layer is also possible. As described in the following, when a rod lens array is omitted in a printer head, this structure is preferable though not essential.

(Etching Stop Layer)

When an AlAs layer is used as the etching sacrificial layer, which is not necessarily required in the present invention, GaInP, for example, can be used as an etching stop layer.

(Buffer Layer)

It is to be noted that, by forming a buffer layer before the etching sacrificial layer is grown on the first substrate, for example, a compound semiconductor substrate such as a GaAs substrate, a Ge substrate, or a GaN substrate, a satisfactory epitaxial layer with a small number of defects can be obtained. For example, a GaAs thin film as the buffer layer can be formed on the GaAs substrate. In the case of a Ge substrate, GaInAs or the like is suitable for lattice strain relaxation.

(Alignment)

It is to be noted that the alignment between the first substrate and the second substrate can be performed using a double-sided aligner used for wafer bonding or the like. In particular, when the second substrate is a silicon substrate, the passing-through groove provided in the substrate may be used as an alignment mark. Further, the passing-through groove may be formed on a scribe line. The light-emitting layer transferred onto the silicon has an area as large as several hundred microns which corresponds to a chip size, and device separation of individual light-emitting devices of several ten microns and the like are fixed in a process after the transfer. Therefore, bonding the island-shaped active layer to the passing-through groove does not require the accuracy of several microns which is required in a device process, and an accuracy of several ten microns is satisfactory. From this viewpoint, an orientation flat of a wafer may be used as the standard of the alignment.

(Bonding and Separating Processes)

Description with regard to the bonding is now made. The bonding is easily carried out by heating to a temperature of several hundred degrees or higher which is the glass transition temperature of the organic insulating layer as the insulating film 2010 in FIG. 1 to give tackiness thereto and by press bonding the silicon wafer. The bonding strength is satisfactory with no problem in subsequent processes. A void which is liable to occur in direct bonding without using an adhesive layer and without tackiness is separated in an island shape and the active layer exists. Therefore, intake of air easily disappears along the separation groove between the islands in pressure bonding. Bonding under a reduced pressure decreases the amount of the void itself, and thus, formation of the gap itself is drastically reduced. In order to transfer and separate two wafers bonded to each other, an etchant bath may be disposed in a vacuum to soak the member in the etchant under a reduced pressure such that the etchant penetrates into the sacrificial layer more uniformly through the passing-through groove. Further, vibration by ultrasound, heating, and rotational motion such as axial revolution and orbital revolution of the wafer itself increase liquid circulation speed to complete the transfer and separating processes uniformly in a short time.

It is to be noted that, in the following, a method of forming a compound semiconductor multilayer film on a first substrate such as GaAs via an etching sacrificial layer (also referred to as a separation layer) and forming a pair formed of the two layers a plurality of times such that decreasing the cost of the process can be expected is described.

(About Multiple Epitaxial Growth)

Description is made with reference to FIGS. 21A to 21E.

In FIG. 21A, a reference numeral 1000 denotes a first substrate (for example, GaAs), and a reference numeral 2101 denotes a buffer layer.

Because AlAs (AlGaAs) having highly selective etching characteristics is used as a separation layer 2102, a substrate on which such layers can be epitaxially grown is the first substrate. Exemplary substrates include a GaAs substrate and a Ge substrate the crystal lattice constants of which are close to that of AlAs (AlGaAs). Although the lattice constant of Si is different from that of GaAs by about 4%, it is possible to directly grow GaAs on Si. Therefore, it is also possible to use an Si substrate having a GaAs film grown thereon as the first substrate 1000. Further, an impurity may be doped in these substrates.

Portions other than the first substrate 1000 in FIG. 21A are now described.

The separation layer 2102 and a light-emitting layer 2103 including an active layer are epitaxially grown on the first substrate 1000 in sequence.

The material of the separation layer 2102 is AlAs or $Al_{(x)}Ga_{(1-x)}As$ ($x \geq 0.7$), and the film thickness is preferably several ten to several hundred nanometers.

The light-emitting layer 2103 is a compound semiconductor multilayer film as a light-emitting device, and, for example, GaAs, AlGaAs, InGaAs, GaP, InGaP, or AlInGaP is used. There is a pn junction in the light-emitting layer 2103.

It is to be noted that, although there is a case where a buffer layer 2101 is formed prior to formation of the separation layer 2102, this is arbitrary. The object of the buffer layer 2101 is to decrease crystal defects and the like.

As long as the growth can be uniform, the growth method is not specifically limited, and any of MOCVD, MBE, LPE, and the like may be used.

Further, the separation layer 2102 and the light-emitting layer 2103 are paired, and a plurality of pairs of separation layers 3102 and 4102 and light-emitting layers 3103 and 4103 are grown in sequence such that the number of the pairs reaches n. Here, it is not necessary to make uniform the thickness of the separation layer 2102. It is also possible to make the thickness smaller as the layer goes up.

This is one method to avoid useless etching as much as possible in a lower layer portion of an outer peripheral portion of the first substrate 1000 taking into consideration such a characteristic that, when the separation layer 2102 is side-etched, the smaller the film thickness is, the higher the etching rate is.

Then, as illustrated in FIG. 21B, a light reflection layer 4104 is formed on the uppermost light-emitting layer 4103.

Then, a resist patterning 2105 is formed so as to leave the light reflection layer 4104 in an island shape.

The material of the light reflection layer 4104 is preferably a material having a high reflectivity with respect to the wavelength of a light-emitting device to be formed. For example, when the material of the light-emitting device is of the GaAs type and the light-emitting wavelength is about 750-800 nm, Au (gold), Ag (silver), Al (aluminum), and the like are preferable. Of course, other light-reflecting materials may be used.

In the case of a blue light-emitting device the wavelength of light emitted by which is about 360 nm, the material of the light reflection layer 4104 is preferably Al or the like. It is to be noted that the DBR layer described in the above may be used instead of the light reflection layer, and it may be possible that no specific light reflection layer is provided. In other words, the light reflection layer 4104 may be omitted.

Further, the light-emitting layer 4103 in an island shape may form a light-emitting layer of one light-emitting device or may be a region where a plurality of light-emitting devices are included in an array. Here, it is preferable that the size of the island-shaped light-emitting layer 4103 is in agreement with the chip size when the second substrate 2000 to be described below is diced.

The light reflection layer 4104 is not essential. It may be formed on the side of the second substrate 2000 described in the following, or it may be completely omitted.

Then, as illustrated in FIG. 21C, the light reflection layer 4104 and the uppermost light-emitting layer 4103 are etched in an island shape to expose part of the uppermost separation layer 2102. It is to be noted that the above-described first groove surrounds the light-emitting layer such that the light-emitting layer is in an island shape.

As illustrated in FIG. 21D, the first substrate 1000 is bonded to the second substrate 2000.

The material of the second substrate 2000 is arbitrary, and any material may be used including a semiconductor substrate such as an Si substrate, a conductive substrate, and an insulating substrate. As described in the above, a driver circuit for driving the light-emitting layer and the like may be provided. Further, an insulating film such as an organic material film may be provided on the surface.

Further, a light reflection layer 4104 may be formed on the surface of the second substrate 2000. Further, the reflection layer 4104 may be formed on the surfaces of the first substrate 1000 and of the second substrate 2000 or the reflection layers 4104 may be bonded to each other.

As the method of bonding the first substrate 1000 to the second substrate 2000, heating after bonding, pressurizing, using the both, and the like may be used. Bonding in an atmosphere under a reduced pressure is also effective.

It is to be noted that, as already described, although the second groove (passing-through groove) according to the present embodiment is provided in the second substrate 2000, it is omitted in the drawings.

As a result of the bonding, space 2106 made by the patterned groove is formed in proximity to the interface. The first groove and the second groove are connected to the space 2106.

FIG. 21E is a view illustrating a state where the substrates are separated.

The separation is achieved by etching the separation layer 4102 which is the uppermost layer.

Here, the etchant flows into the space 2106 formed by the island-shaped separation region.

The separation layer 4102 which is the uppermost layer is etched, and, as a result, the first substrate 1000 and the second substrate 2000 are separated. As the etchant used here, a hydrofluoric acid solution, a hydrochloric acid solution, or the like may be used.

As a result, the light-emitting layer 4103 in the island-shaped region is transferred onto the second substrate 2000.

The second substrate 2000 onto which the light-emitting layer 4103 is transferred proceeds to the device process, and a light-emitting device is formed.

On the other hand, the surface of the first substrate 1000 which lost the uppermost light-emitting layer 4103 and the uppermost separation layer 4102 due to the transfer and etching becomes the light-emitting layer 4103, and the process returns to the one illustrated in FIG. 21A.

When the light-emitting layer 4103 and the separation layer 4102 are paired, by repeating n times the above-described process in which n is the number of times the pair is formed, substrates for forming n light-emitting devices can be formed. It is to be noted that, although a case where the separation layer and the light-emitting layer are paired is described, the reflection layer may be added to the pair to form a set of the three layers and the set may be laminated a plurality of times.

As described in the above, according to the present invention, a novel semiconductor article manufacturing method and a novel member are provided. When a light-emitting device, typically an LED, is manufactured in a chip, further, a device separating process, a wiring process, a process for dicing the second substrate, and the like are appropriately performed. With regard to the device separation for manufacturing an LED having a plurality of light emitting points on a chip, for example, when the conductivity type of the front surface side of the compound semiconductor multilayer film is p, patterning is carried out to an n-type layer below that or nearly to the active layer to remove them. In this way, the device separation can be carried out. It is to be noted that the direction of the dicing and the second passing-through groove may be opposite to those in the case illustrated in FIG. 3. More specifically, not the passing-through groove along the direction of the long side of the chip as illustrated in FIG. 3 but a passing-through groove perpendicular thereto is provided along the direction of the short side. In such a case, when the arrangement is in an array along the direction of the long side of the rectangle of the upper surface, the space between chips has a side surface formed not by dicing but by a passing-through groove (manufactured by, for example, RIE) provided in advance. This is preferable taking into consideration a case where dense arrangement is made. Of course, it is also preferable to form grooves intermittently provided along both the direction of the long side and the direction of the short side of the chip. In such a case, a passing-through groove along the direction of the long side and a passing-through groove along the direction of the short side are intermittently provided below the island-shaped compound semiconductor multilayer film.

Second Embodiment

Figure 6:
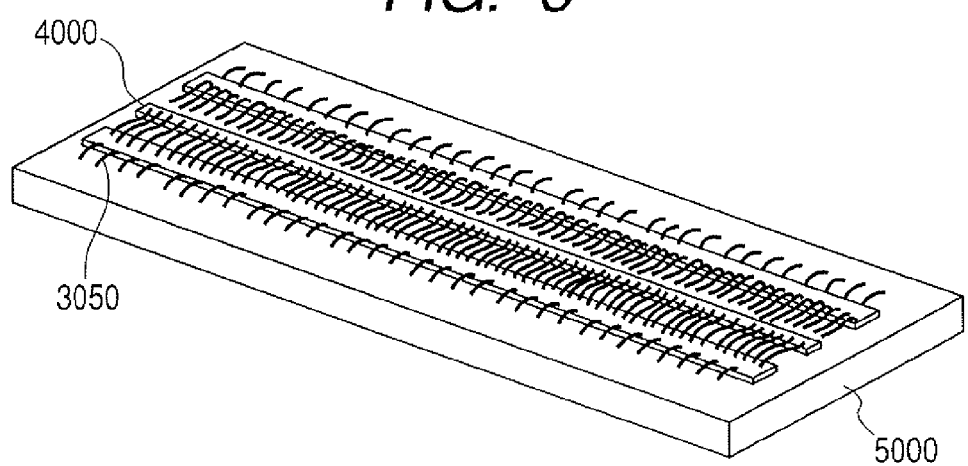
FIG. 6 is a view illustrating an LED printer head.

By using the manufacturing method described in the first embodiment, an LED array as illustrated in FIG. 6 is provided. FIG. 6 is a sectional view illustrating an exemplary structure where a driving circuit and an LED array are connected on a wiring substrate. The LED array can be obtained by, in the process (7) of the above-described semiconductor article manufacturing method, forming a plurality of LED devices on an island-shaped compound semiconductor multilayer film on a silicon substrate and dividing the silicon substrate by dicing. The cross sectional structure of the respective LED devices is the same as LED devices including an LED light emitting region on the left in FIG. 7 and FIG. 15 described in the following. In FIG. 6, a plurality of LED array chips 4000 are arranged on a wiring substrate 5000 in a line, and a plurality of driver ICs 3050 similarly arranged in a line on both sides of the plurality of LED array chips 4000, and the LED array 4000 are electrically connected with the plurality of driver ICs 3050 by wire bonding. The respective LED devices of the LED array chips 4000 are electrically connected with drive devices of the driver ICs 3050 alternately arranged on both sides of the LED array chips 4000 by wire bonding. Here, the plurality of driver ICs 3050 are arranged in a line on both sides of the plurality of LED array chips 4000 disposed in a line. Of course, if mounting is possible, the plurality of driver ICs 3050 may be arranged on one side of the plurality of LED array chips 4000.

Figure 5:
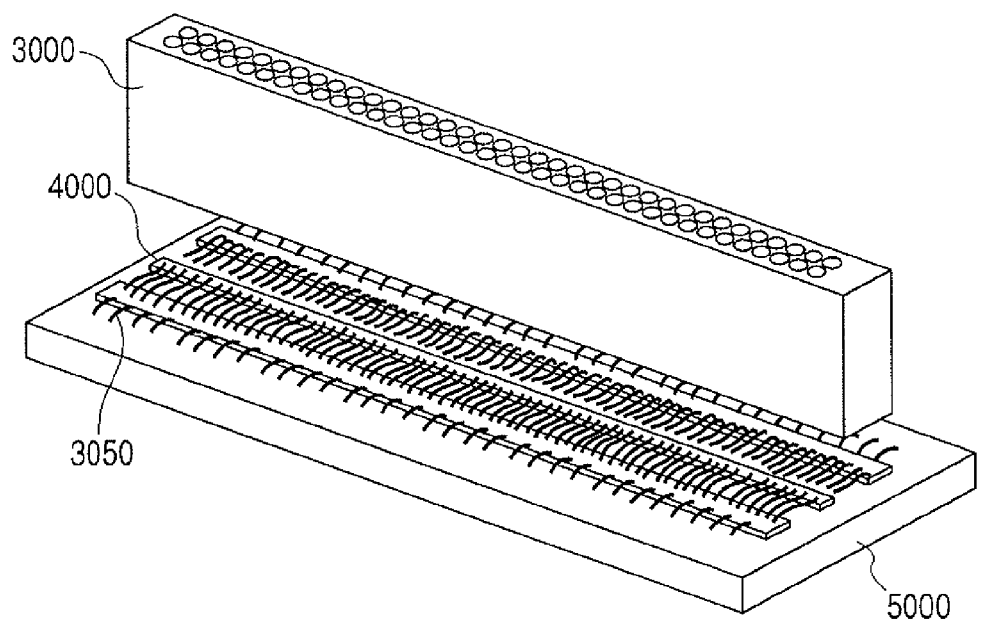
FIG. 5 is a sectional view illustrating an exemplary structure where a driving circuit and an LED array are connected on a wiring substrate.

Further, by mounting, as necessary, a rod lens array (for example, an SLA: Selfoc Lens Array) 3000 on the LED array chips 4000 arranged in a line, an LED printer head (FIG. 5) may be formed. Light emitted from the LED array 4000 disposed in a line is collected by the rod lens array 3000 to obtain an LED array image 3060.

It is to be noted that, when, as described in the above, an LED device forming layer is provided on the silicon substrate via a metal film or a DBR mirror, by improving the directivity and increasing the brightness, a device light emitting point having enough brightness is materialized even if the device dimension is one obtained by microfabrication. Therefore, it is possible to omit the rod lens array and to directly form a latent image on a photosensitive member directly from an LED printhead, and the LED printer head having the structure illustrated in FIG. 5 the number of parts of which is small and the economic effect of which is great may be formed.

It is to be noted that, although FIG. 6 illustrates a case where the driver ICs (driving circuit) and the LED devices are connected with each other by wire bonding, the driver circuit may be directly built on the side of the Si substrate to be connected with the LED devices (FIG. 7 in which a reflection layer is provided on an organic insulating layer immediately below a device).

In FIG. 7, an insulating film 7010 formed of an organic material is provided on a silicon substrate 7000 including a MOS transistor 7060 which forms a driver IC. Then, an LED light emitting region 7070 formed of a compound semiconductor multilayer film is provided on the insulating film 7010. A reference numeral 7080 denotes an insulating film (such as SiO$_2$ or SiN) and a reference numeral 7050 denotes a wire pad to be a source or drain region of the MOS transistor 7060. A reference numeral 7081 denotes a layer which functions as a mirror (for example, a metal mirror of Ti, Au, or the like) and reference numerals 7083 and 7084 denote wiring, embedded wiring, or an electrode pad.

In this way, by including the driver ICs for driving on the side of the second substrate to be bonded, as illustrated in FIG. 19, a chip 1960 illustrated in FIG. 19 can be cut out by dicing in a dicing direction 1625. It is to be noted that FIG. 19 illustrates a state where the cut chip arrays 1960, an enlarged view of which is shown in FIG. 19A, are arranged on a print substrate 1930. A reference numeral 1911 denotes a second substrate. It is to be noted that, although a second groove which is a passing-through groove is intermittently provided in the second substrate along the long side of the chip as illustrated in FIG. 3, it is omitted in FIG. 19.

Figure 8:
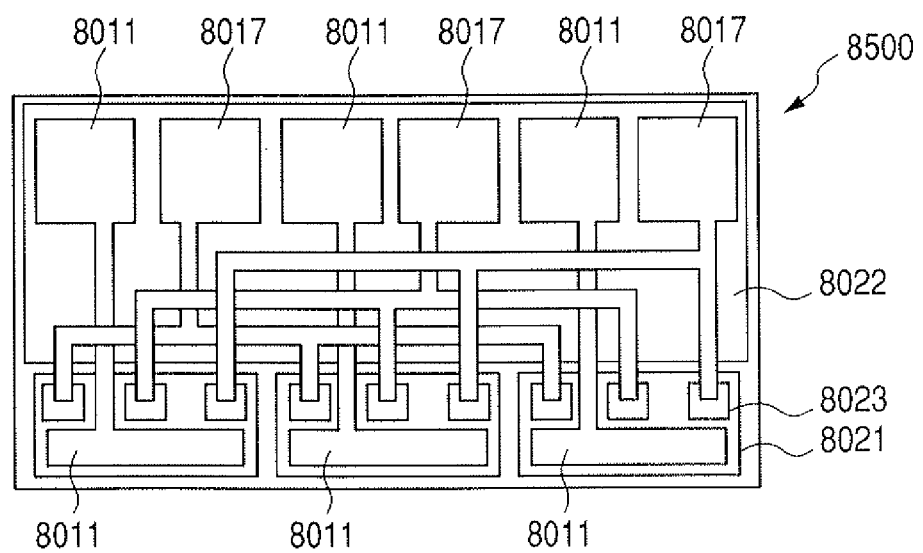
FIG. 8 is a view illustrating a light-emitting device array circuit 8500 which can be time-division driven for decreasing the number of electrodes.

It is to be noted that FIG. 8 illustrates an exemplary matrix drive. FIG. 8 is a view illustrating a light-emitting device array circuit 8500 which can be time-division driven for decreasing the number of electrodes. In FIG. 8, a reference numeral 8011 denotes an n-side electrode, a reference numeral 8017 denotes a p-type electrode, a reference numeral 8021 denotes an insulating film on n-type AlGaAs, a reference numeral 8022 denotes an insulating film on a p-type GaAs contact layer, and a reference numeral 8023 denotes a light emitting region.

It is to be noted that, although, in the present embodiment, the LED array chip using an LED as a light-emitting device is used, of course, an LD (Laser Diode) array chip may be used.

FIG. 20 illustrates an exemplary modification of an embodiment illustrated in FIG. 7. Like reference numerals are used to designate portions having functions like ones in FIG. 7. In FIG. 7, the mirror 7081 is provided on the side of the organic insulating film 7010 and the silicon substrate 7000. In FIG. 20, a mirror layer 7021 (a metal mirror, a DBR layer, or the like) is provided directly on the compound semiconductor multilayer film 1020. In such a case, because light generated by the light emitting region 1020 toward the substrate can be reflected without passing through the organic insulating film 7010, the performance is extremely increased. In FIG. 7, electrical connection with the driving circuit 7060 is made using the mirror layer 7021. It is to be noted that, when the mirror layer is a low resistance (n+) DBR, similarly, the mirror can be used to make electrical connection with the driving circuit.

Third Embodiment

Figure 9A:
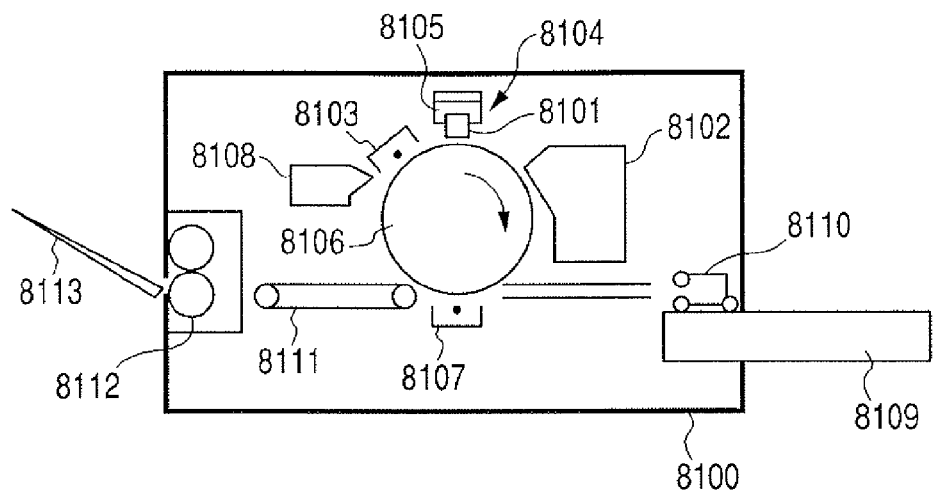
FIG. 9A is a conceptual view illustrating an exemplary structure of an LED printer.

FIG. 9A illustrates an exemplary structure of an LED printer using the LED printer head described in the second embodiment.

FIG. 9A is a schematic sectional view illustrating an exemplary structure of the LED printer according to the present invention.

In FIG. 9A, a photosensitive drum 8106 which rotates clockwise is housed in a printer body 8100. An LED printer head 8104 for exposing the photosensitive drum is provided above the photosensitive drum 8106. The LED printer head 8104 is formed of an LED array 8105 where a plurality of light-emitting diodes which emit light according to an image signal and a rod lens array 8101 for imaging the light emitting pattern of the respective light-emitting diodes on the photosensitive drum 8106. Here, the rod lens array 8101 has the structure described in the above embodiment. The arrangement is made such that the imaging surface of the light-emitting diodes produced by the rod lens array 8101 and the location of the photosensitive drum 8106 are aligned with each other. More specifically, the light emitting surface of the light-emitting diodes and the photosensitive surface of the photosensitive drum are made to be in an optically conjugate relationship by the rod lens array.

A charging unit 8103 for uniformly charging the surface of the photosensitive drum 8106 and a developing unit 8102 for making toner attach to the photosensitive drum 8106 according to an exposure pattern by the printer head 8104 to form a toner image are provided around the photosensitive drum 8106. A transfer charging unit 8107 for transferring a toner image formed on the photosensitive drum 8106 onto a transfer material such as a copy sheet, not shown in the figure, and cleaning means 8108 for collecting residual toner on the photosensitive drum 8106 after the transfer are provided around the photosensitive drum 8106. In this way, an imaging unit is formed.

Further, a sheet cassette 8109 loaded with the transfer material and sheet feeding means 8110 for supplying the transfer material in the sheet cassette 8109 between the photosensitive drum 8106 and the transfer charging unit 8107 are provided in the printer body 8100. Further, a fixing device 8112 for fixing the transferred toner image on the transfer material, transport means 8111 for leading the transfer material to the fixing device 8112, and a sheet discharge tray 8113 for holding the transfer material discharged after the fixing are provided.

Figure 9B:
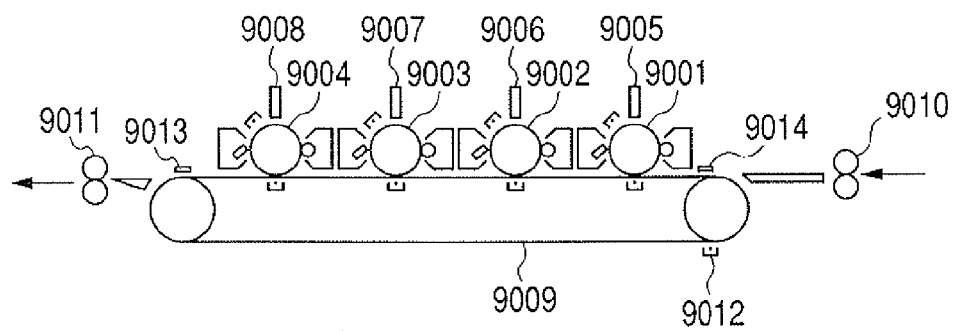
FIG. 9B is a conceptual view illustrating an exemplary structure of a color printer.

FIG. 9B is a schematic view illustrating the structure of an exemplary structure of a color printer according to the present invention. There are a plurality of (four in the figure) imaging units. In FIG. 9B, reference numerals 9001, 9002, 9003, and 9004 denote magenta (M), cyan (C), yellow (Y), and black (K) photosensitive drums, respectively, reference numerals 9005, 9006, 9007, and 9008 represent LED printer heads. A reference numeral 9009 denotes a conveyor belt for transporting the transferred sheet and for making contact with the respective photosensitive drums 9001, 9002, 9003, and 9004. A reference numeral 9010 denotes a resist roller for sheet feeding, and a reference numeral 9011 denotes a fixing roller. A reference numeral 9012 denotes a charger for sucking and holding the transferred sheet onto the conveyor belt 9009, a reference numeral 9013 denotes a charge eliminating charger, and a reference numeral 9014 denotes a sensor for detecting a leading edge of the transferred sheet.

Fourth Embodiment

It is to be noted that, using the semiconductor article manufacturing method described in the first embodiment, an LED device can be manufactured, and, using the LED device, a display device such as a display can be manufactured. In such a case, it is preferable to prepare LEDs which have a plurality of wavelengths.

Fifth Embodiment

Bonded Structure

The invention according to the present embodiment relates to a bonded structure formed by bonding a first substrate to a second substrate.

Regions (1020 in FIG. 2) including a compound semiconductor multilayer film patterned in an island shape are provided on the first substrate via a separation layer, and there is a first groove (1025 in FIG. 1) between the compound semiconductor multilayer film regions.

The shape of the compound semiconductor multilayer film regions seen from the top is a rectangle having a long side direction 2901 and a short side direction 2902.

The second groove 2005 which passes through the second substrate is provided in the second substrate 2000. By intermittently providing a plurality of the second grooves in parallel along the direction of the long side, a passing-through groove group in the direction of the long side (3998 in FIG. 3) is formed.

The passing-through groove group in the direction of the long side 3998 is characterized in that a plurality of the passing-through groove groups are arranged so as to be in parallel with one another at intervals which are equal to or longer than the length of the short side of the island-shaped compound semiconductor multilayer film regions. The intervals referred to here are denoted by arrows 3999 in FIG. 3. In a state where the two substrates are bonded to each other, the region 1020 is located between two second grooves. With this state, by dicing the bonded structure in the direction of the short side, chips can be formed.

It is to be noted that the separation layer, the first and second substrates, the region including the compound semiconductor multilayer film and the like which appear in the description of the present embodiment are all applied except in cases where the description in the above-described embodiments becomes inconsistent. In particular, it is also preferable that, with regard to the second substrate, the silicon wafer is provided with a driver such as a driving circuit.

It is to be noted that the length in the direction of the long side of the region 1020 may be equal to or shorter than the length of the second passing-through groove in the direction of the long side. Of course, for example, the length of the region 1020 in the direction of the long side may be set to the length corresponding to that for four passing-through grooves.

Sixth Embodiment

Further, another aspect of the present invention has the following characteristics.

A method of manufacturing a light-emitting device including forming on a first substrate a separation layer and a light-emitting layer in the stated order from the side of the first substrate, forming a bonded member by bonding the first substrate to a second substrate with the light-emitting layer being positioned inside, and transferring the light-emitting layer onto the second substrate by etching and removing the separation layer, characterized in that, with the separation layer and the light-emitting layer on the first substrate being regarded as one pair, formation of the pair is repeated n times (n is a natural number which is equal to or larger than two), after patterning only the uppermost light-emitting layer in the shape of a plurality of islands, the first substrate is bonded to the second substrate to form a bonded structure, and an etchant is caused to penetrate into a space formed in the bonded structure by the island-shape patterning to bring the separation layer into contact with the etchant to selectively transfer the island-shaped light-emitting layer onto the second substrate.

Seventh Embodiment

Further, still another aspect of the present invention has the following characteristics.

A light-emitting device characterized in that a light-emitting device is provided on a silicon substrate via a DBR mirror.

After a so-called microcavity LED structure with a DBR is formed, the structure is transferred onto a silicon substrate to materialize a spot with higher directivity, and a contact-type printer head where a rod lens is not essential can be obtained.

Further, an LED array manufacturing method includes forming a separation layer, a light-emitting layer, and a DBR layer in the stated order on the surface of a first semiconductor substrate and bonding it to a second substrate having a semiconductor circuit formed thereon via an insulating film, transferring the light-emitting layer and the DBR layer of the first substrate onto the second substrate by etching and removing the separation layer, making the transferred light-emitting layer in an array of a plurality of light-emitting portions, and electrically connecting the plurality of light-emitting portions with an electrode portion of the semiconductor circuit for controlling light emission of the light-emitting portions.

The present invention is described using an example in the following.

EXAMPLE

An example is described with reference to FIGS. 10 to 18B.

First, a p-GaAs substrate 1000 is prepared. After a buffer layer which is not shown in the figures is formed as necessary, a GaInP layer as an etching stop layer 1009 is formed. A p-AlAs layer as an etching sacrificial layer 1010 is formed on that. Further, a compound semiconductor multilayer film 1020 is formed. The multilayer film is formed of an n-type GaAs contact layer, an n-type clad layer, a p-type active layer, a p-type clad layer, and a p-type contact layer from the top in the stated order.

Figure 10:
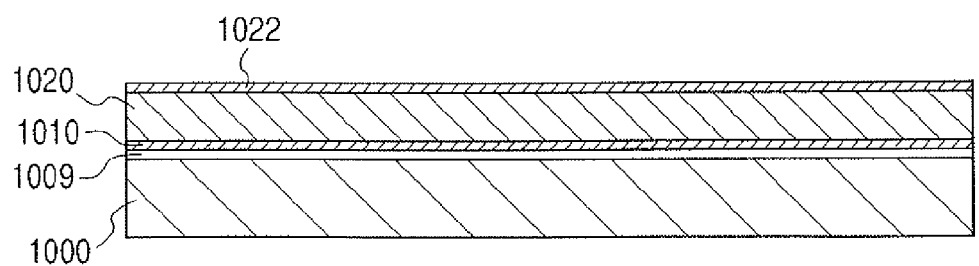
FIG. 10 is a view illustrating an example of a method of manufacturing a semiconductor article according to the present invention.

Further, on that, an AlGaAs multilayer film (ten pairs of $Al_{0.8}GaAs/Al_{0.2}GaA$) 1022 is formed to function as a DBR mirror (FIG. 10).

Figure 11:
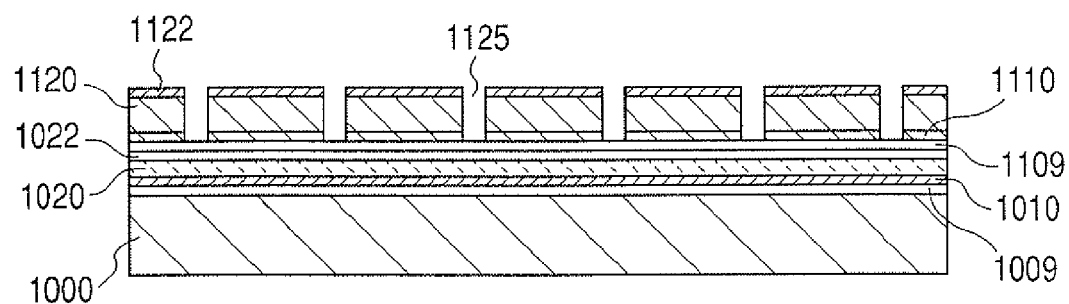
FIG. 11 is a view illustrating the example of a method of manufacturing a semiconductor article according to the present invention.

It is to be noted that the etching stop layer, the sacrificial layer, and the compound semiconductor multilayer film may be repeatedly formed (multiple epitaxial growth). An example of such case is illustrated in FIG. 11. A GaInP layer as an etching stop layer 1109 is formed on the AlGaAs multilayer film 1022. A p-AlAs layer as an etching sacrificial layer 1110 is formed on that. Further, a compound semiconductor multilayer film 1120 is formed. Further, on that, an AlGaAs multilayer film (ten pairs of $Al_{0.8}GaAs/Al_{0.2}GaA$) 1022 is formed to function as a DBR mirror.

As illustrated in FIG. 11, a first groove 1125 is formed by etching with a resist being as a mask. The epitaxial layer 1120 is separated into chips. For example, a size of 250 μm×8 mm and a separation width of about 80 μm which correspond to a scribe line are preferable. Alternatively, for the purpose of promoting the etching, the chip width of 250 μm may be decreased. The shortest possible length may be several ten microns which is the size of the individual LED device.

As illustrated in FIGS. 12A and 12B, a passing-through groove (semiconductor substrate groove) 2005 is formed like a scribe line in the silicon substrate 2000. The groove is in the shape of a rectangle of 80 μm×8 mm and is formed in the silicon substrate so as to pass through the wafer in the longitudinal direction along the scribe line. As the method, deep RIE which is practically used in MEMS, sandblasting, or the like is applied. It is to be noted that the silicon substrate having the groove formed therein may have a driving circuit formed thereon, or may be used as it is with no device layer, using such original characteristics of silicon that the thermal conductivity is three times as high while the price is less than one tenth.

Then, a positive type photosensitive organic insulating film polyimide is spin coated to cover the passing-through groove with the photosensitive organic insulating film (organic material film) 2010. After that, UV light is applied through the passing-through groove. This makes it possible to remove the organic insulating film above the passing-through groove in the silicon in a self-aligning manner. In this way, a third passing-through groove 2006 is provided in the organic insulating film. The positive type photosensitive polyimide and the organic insulating layer used as a permanent adhesive layer are applied on the surface of the silicon substrate with the groove, and the polyimide covering the groove is exposed and developed by the UV light application from the rear surface of the substrate and is removed.

FIG. 12B illustrates the passing-through groove seen from the top of a four- or six-inch wafer.

Figure 13A:
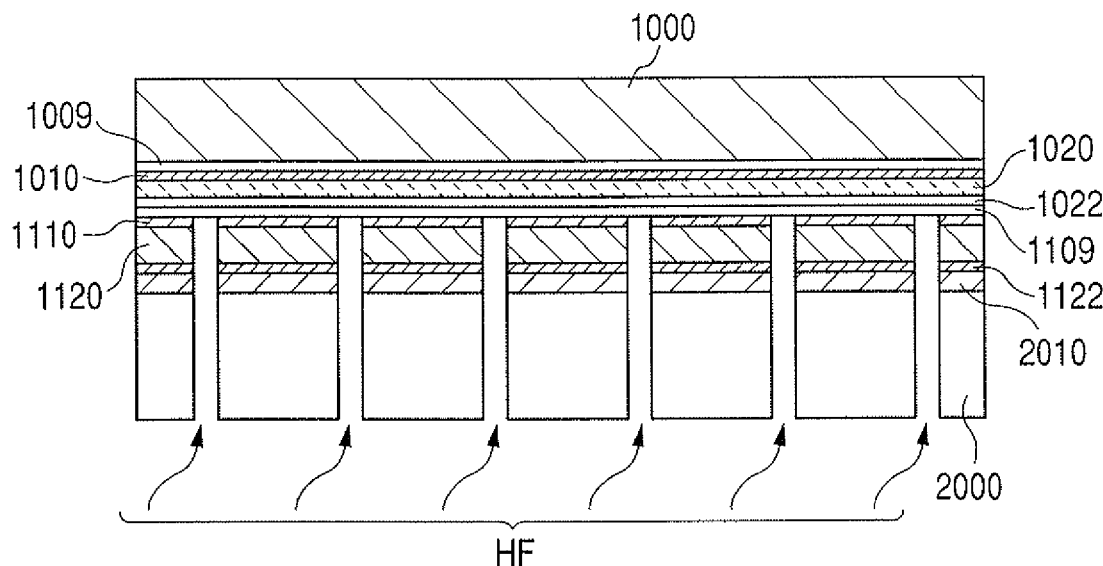
FIG. 13A and FIG. 13B are views illustrating the example of a method of manufacturing a semiconductor article according to the present invention.
Figure 13B:
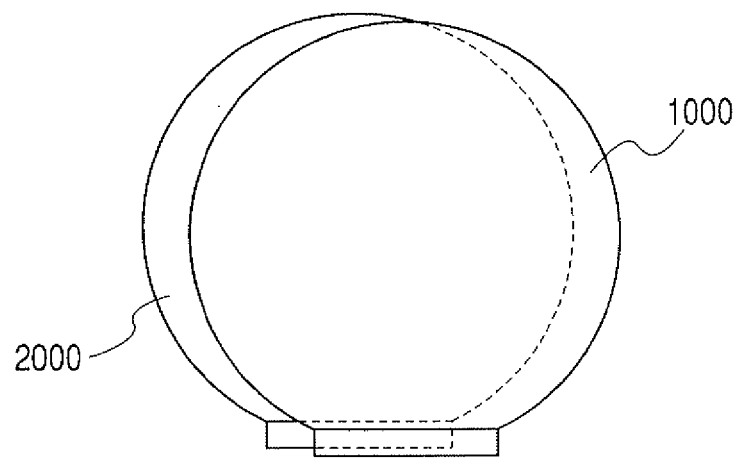

As illustrated in FIGS. 13A and 13B, the two substrates are bonded to each other. The bonding is carried out by pressurization and heating after preheating the organic insulating film 2010 to a temperature higher than the glass transition temperature to enhance the adhesion. It is to be noted that, when multiple transfer is carried out using a multiple epitaxial layer, after the DBR reflection layer and the device layer are etched to the AlAs sacrificial layer with regard to each chip size, the bonding is carried out in order to cause an etchant to penetrate into the groove. It is effective to cause an etchant to enter therein or to help the entry of an etchant using a jet stream. It is also effective to put the bonded wafer pair under a reduced pressure or to decompress the gap to promote the entry of the etchant.

The surface of the epitaxial layer separated by the groove existing in the organic insulating film is pressed against, adhered to, and bonded to the surface of a tacky (adhesive) polyimide to materialize bonding without a void. The polyimide layer is used as an adhesive layer and as a permanent insulating layer for device separation. It is preferable that a metal mirror or a DBR mirror is directly provided on the side of the bonded epitaxial layer as a light reflection layer. In that case, compared with a case where a reflector layer is embedded below the organic insulating film, light loss due to light absorption is avoided, and light is amplified by double, or, when taking into consideration the whole reflectivity of the interface, further light amplification is possible.

Next, the bonded member is soaked in a diluted solution of 2-10% HF to selectively etch and remove the AlAs sacrificial layer 1110. By soaking the bonded substrate in the diluted solution of HF, selective etching of about a hundred thousand times selectivity dissolves the separation layer provided on the interface between the epitaxial layer and the GaAs substrate, and the separation is completed in a short time. When there is no island-shaped separation, depending on the size of the wafer, it may take one week or more to separate the whole area of the wafer.

It is to be noted that, when it is difficult for the etchant to penetrate, it is effective to apply ultrasound or pressure to the etchant to cause the etchant to enter therein, or to help the entry of the etchant using a jet stream. It is also effective to put the bonded wafer pair under a reduced pressure or to decompress the gap thereby to promote the entry of the etchant.

Figure 14:
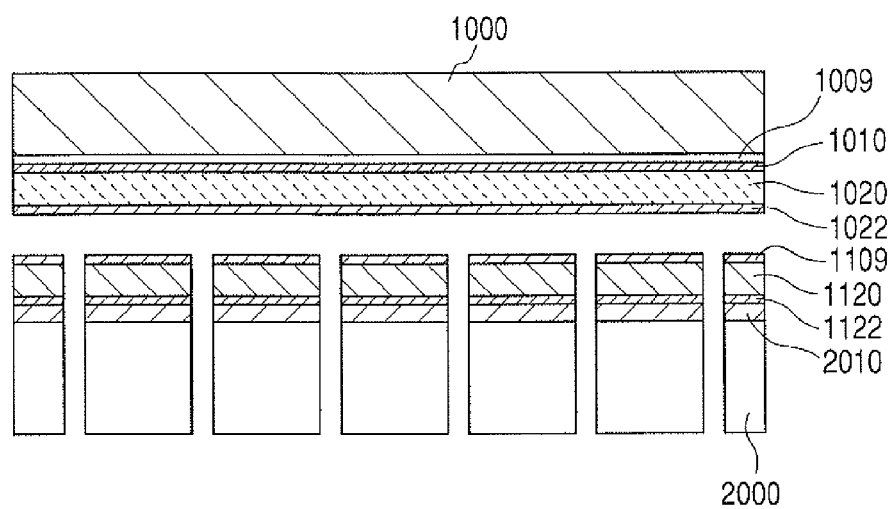
FIG. 14 is a view illustrating the example of the semiconductor article manufacturing method according to the present invention.

Then, as illustrated in FIG. 14, the GaAs substrate 1000 separates from the member.

Figure 15:
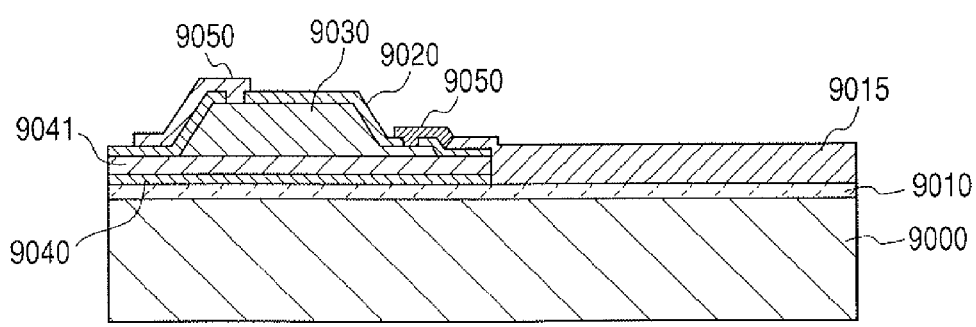
FIG. 15 is a sectional view of an LED array.

After that, the n-layer of the epitaxial layer is exposed by mesa etching. More specifically, as illustrated in FIG. 15, by doping an n-type impurity into a contact layer where a cathode electrode is formed below a clad layer or a reflection DBR mirror, a low resistance layer is formed. Then, an etching stop layer which is GaInP or the like is provided immediately above it, and, as illustrated in the figure, the section of the LED is shaped so as to be trapezoidal and the cathode contact layer is exposed by mesa etching. After that, a passivation film is formed, a contact hole is formed, and the contact hole is filled with a metal to form an LED device.

A reference numeral 9000 denotes a silicon substrate. A driver circuit may be formed thereon as necessary. A reference numeral 9010 denotes an insulating film which is, for example, an organic material. A reference numeral 9015 denotes a wire bonding pad. An insulating film 9010 may be provided as necessary. A reference numeral 9040 denotes a portion which functions as a mirror formed of a metal or the like. This layer may also be provided as necessary. A reference numeral 9050 denotes wiring. A reference numeral 9030 denotes an epitaxial layer, and has, for example, a multilayer structure. A reference numeral 9020 denotes an insulating film. The epitaxial layer 9030 is mesa etched or is subject to device separation as necessary for point emission. This separation (into an array) can be carried out with regard to the respective light emitting point by carrying out the removal until the active layer is exposed or until the n-type layer is exposed, if the conductivity type (p or n) of the surface is, for example, p-type, when the multi-layer structure is seen from the top.

A reference numeral 9041 denotes a portion provided as necessary, and is, for example, a low resistance layer continuously formed on the multilayer film 9030. In other words, the portion 9041 may be omitted. It is to be noted that, when the portion 9040 is a metal, electrical connection with the draw out wiring 9015 is avoided. However, the draw out wiring 9015 and the portion 9040 may be electrically connected such that potential equal to that of the wiring 9015 is maintained.

Figure 16A:
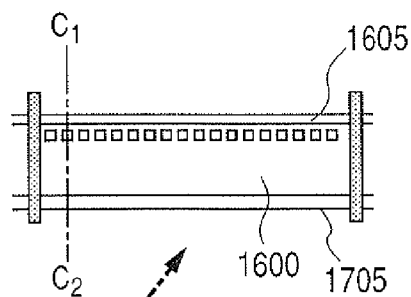
FIG. 16 and FIG. 16A are views illustrating the example of a method of manufacturing a semiconductor article according to the present invention.
Figure 16:
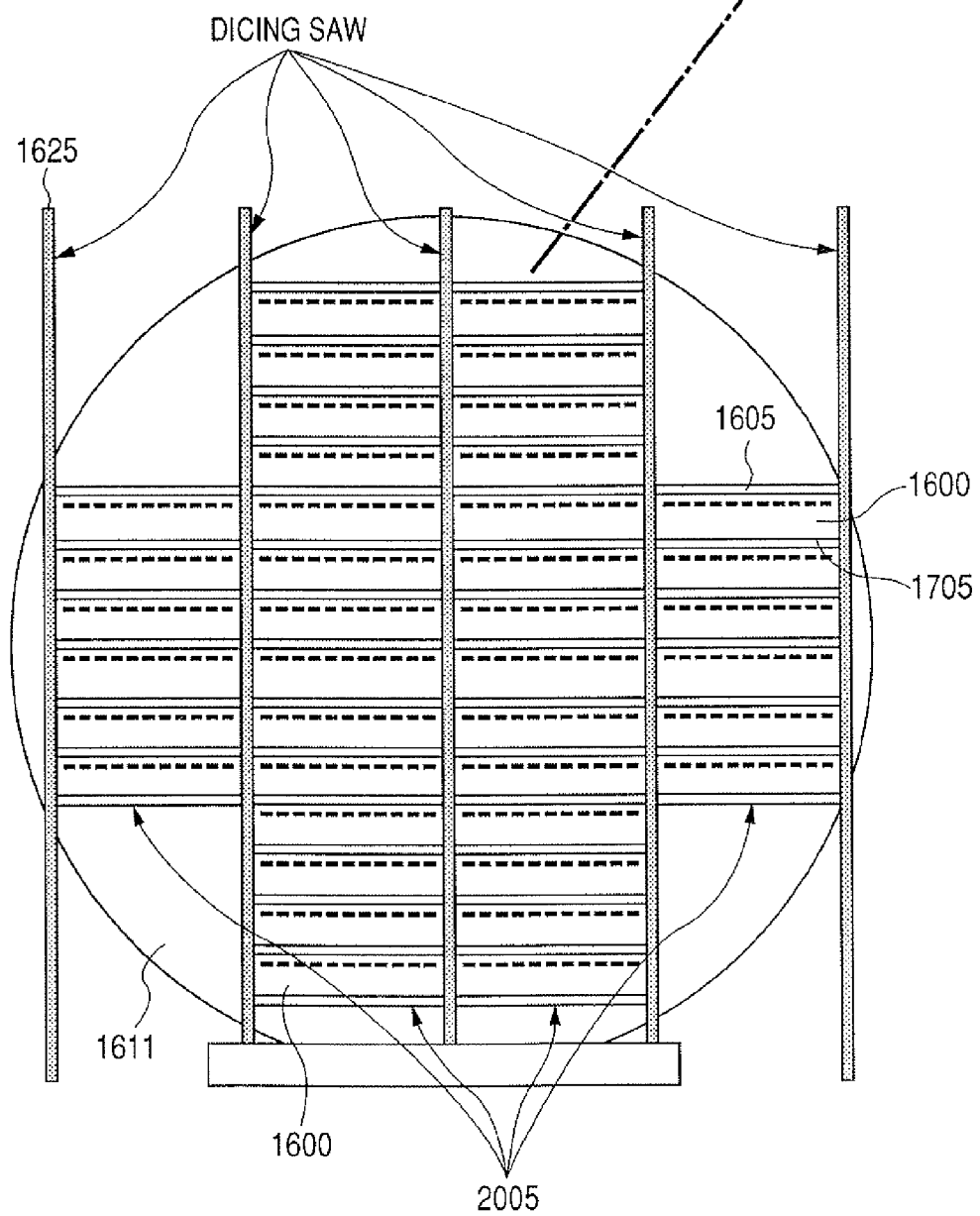

By conducting sawing in a traversal direction of a chip 1600 along a direction 1625 of operating a dicing saw as illustrated in FIG. 16, the wafer is cut, and end portions of the passing-through grooves 2005 aligned in the longitudinal direction of the chips are connected by the sawing. In this way, individual chips 1600 are separated. Of course, by bonding the wafer to a dicing tape, scattering can be prevented in the chip separation. It is to be noted that, in FIG. 16, a reference numeral 1611 denotes a second substrate (for example, a silicon wafer), and reference numerals 1605 and 1705 denote second passing-through grooves provided in the second substrate. Small rectangles in the chip 1600 schematically illustrates light emitting regions.

It is to be noted that, when chipping on end surfaces is a problem in materializing a long array by connecting end surfaces of high density chips, a separation groove is formed between the chips in a direction perpendicular to the longitudinal direction of the chips and a dicing saw is operated in the longitudinal direction. Primarily, cutting of a silicon substrate generates less chipping than cutting of a fragile compound semiconductor substrate. In particular, in the case of 2400 DPI where the distance between devices is about 10 µm and chips have to be connected with such precision, smoothness of groove end surfaces shaped by RIE is effective. It is also effective to leave silicon on four sides of chips and form a passing-through groove therearound. In that case, chip separation is possible only by extending the dicing tape. Because the passing-through groove is formed not by mechanically cutting the semiconductor substrate but by etching which is a chemical reaction, the precision of the cut surface is significantly improved. By operating the dicing saw in a direction perpendicular to the direction of arrangement of the passing-through grooves in arrays as shown by heavy lines in FIG. 16, division into individual chips is carried out. It is to be noted that a section between C1 and C2 in FIG. 16A which is an enlarged view of FIG. 16 is, for example, the chip illustrated in FIG. 15.

Figure 17A:
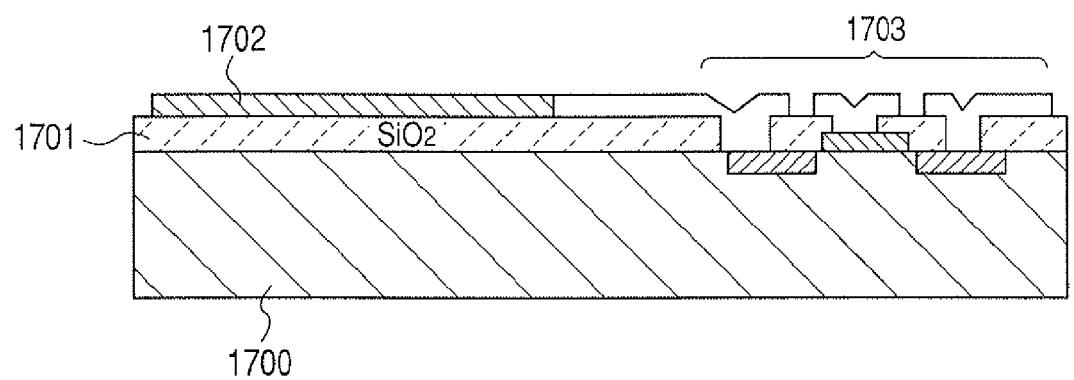
FIG. 17A and FIG. 17B are views illustrating the example of a method of manufacturing a semiconductor article according to the present invention.
Figure 17B:
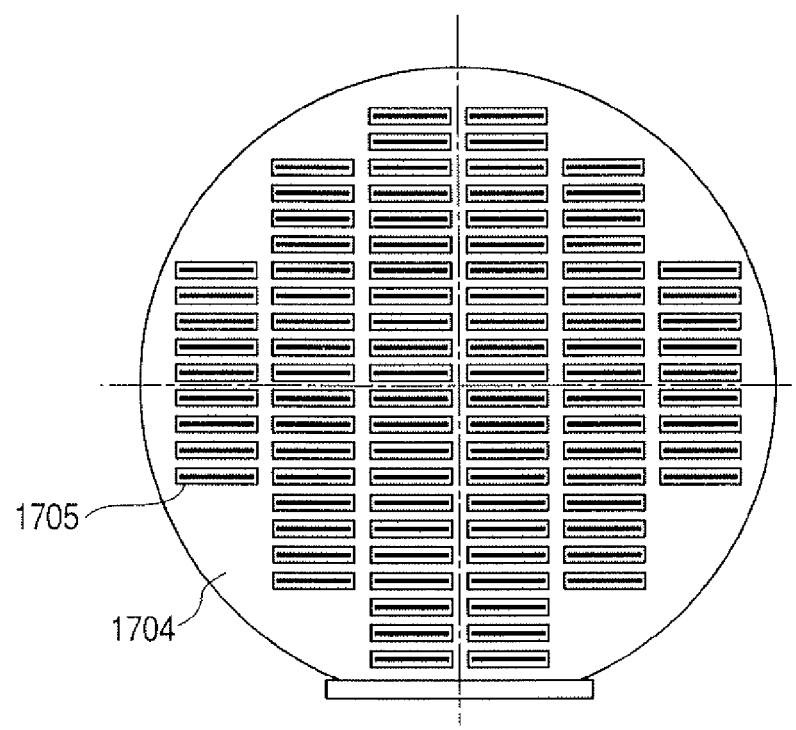

FIG. 17A illustrates a structure where a driver circuit is formed on a silicon substrate. FIG. 17B is a plan view where such driving circuit chips including shift resisters, latches, and the like are arranged on a wafer surface. In FIGS. 17A and 17B, a reference numeral 1700 denotes a silicon substrate, a reference numeral 1701 denotes an insulating film formed of $SiO_2$, a reference numeral 1702 denotes a wire bonding pad, a reference numeral 1703 denotes a MOS transistor forming the driving circuit, a reference numeral 1704 denotes a silicon wafer, and a reference numeral 1705 denotes a driving circuit chip.

As illustrated in FIG. 18, first, a silicon driving circuit chip 1822, an enlarged view of which is shown in FIG. 18A, is cut out from a silicon wafer 1800 by a dicing saw, and an LED chip 1821, an enlarged view of which is shown in FIG. 18B, is cut out from a silicon wafer 1820 by a dicing saw. The dicing is preferably carried out with the rear surface of the second substrate being bonded to a dicing tape.

Then, die bonding of the silicon driving circuit chip 1822 and the LED chip 1821 to a print substrate 1830 is carried out to electrically connect the silicon driving circuit chip 1822 and the LED chip 1821 by wire bonding. After that, the print substrate 1830 and the driver circuit of the silicon driving circuit chip 1822 are connected with each other by wire bonding. Further, a light amount variation correction circuit IC is added to obtain an LED array.

Although representative embodiments and an example of the present invention are described in the above, various variations of the present embodiment and the present example are possible, and various replacement and modifications are possible which fall within the gist and scope of the present invention defined by the claims of the present application.

According to the present example, by using a silicon substrate with a passing-through groove, the number of bonding processes for transferring a compound semiconductor multi-layer film onto a silicon substrate can be significantly decreased compared with that in Japanese Patent Laid-Open Application No. 2005-012034 described in the above. Remarkable effects attributable to improvement in the device yield and decrease in the number of processes are expected.

INDUSTRIAL APPLICABILITY

The present invention can be used for an array device where semiconductor devices are formed in an array on a semiconductor substrate, in particular, for an LED printer, a display, a device for optical transmission and reception, or a light-receiving device using an LED device formed on a semiconductor substrate. When it is used in a light-receiving device, a scanner can be formed. When the light-receiving device is used together with an LED array head, a scanner with a built-in illumination system is manufactured.

While the present invention has been described with reference to exemplary embodiments, it is to be understood that the invention is not limited to the disclosed exemplary embodiments. The scope of the appended claims is to be accorded the broadest interpretation so as to encompass all such modifications and equivalent structures and functions.

This application claims the benefit of Japanese Patent Application No. 2006-293306, filed Oct. 27, 2006, and No. 2006-311625, filed Nov. 17, 2006 which are hereby incorporated by reference herein in their entirety.

The invention claimed is:

1. A method of manufacturing a semiconductor article comprising the steps of:
   preparing a first structure comprising a first semiconductor substrate, a compound semiconductor multilayer film, and an etching sacrificial layer provided between the first semiconductor substrate and the compound semiconductor multilayer film;
   preparing a second structure comprising a second semiconductor substrate and an insulating layer;
   bonding the first structure and the second structure;
   forming a second groove intermittently in the second semiconductor substrate;
   forming a third groove in the insulating layer through the second groove;
   forming a first groove in the compound semiconductor multilayer film through the second and third grooves so as to expose the etching sacrificial layer; and
   etching the etching sacrificial layer through the first, second, and third grooves so as to separate the first semiconductor substrate and transfer the compound semiconductor multilayer film to the second semiconductor substrate from the first semiconductor substrate.

2. A method of manufacturing a semiconductor article according to claim 1, wherein an etching stop layer for stopping etching of the first semiconductor substrate is provided between the first semiconductor substrate and the etching sacrificial layer.

3. A method of manufacturing a semiconductor article according to claim 2, wherein the etching stop layer, the etching sacrificial layer, and the compound semiconductor multilayer film are alternately repeatedly laminated on the first semiconductor substrate.

4. A method of manufacturing a semiconductor article according to claim 1, wherein a circuit layer is provided on the surface of the second semiconductor substrate.

5. A method of manufacturing a semiconductor article according to claim 1, wherein the etching sacrificial layer and the compound semiconductor multilayer film are alternately repeatedly laminated on the first semiconductor substrate.

6. A method of manufacturing a semiconductor article according to claim 1, wherein at least one of a metal film and a DBR mirror is provided between the compound semiconductor multilayer film and the insulating layer.

7. A method of manufacturing a semiconductor article according to claim 1, wherein the insulating layer is made of a polyimide insulating material.

8. A method of manufacturing a semiconductor article according to claim 1, wherein the second semiconductor substrate comprises a driver circuit for driving a light-emitting device formed so as to include the compound semiconductor multilayer film.

9. A method of manufacturing a semiconductor article according to claim 1, wherein the first groove is provided in the compound semiconductor multilayer film such that the compound semiconductor multilayer film is divided in an island shape, and wherein the method further comprises a step of forming a light-emitting device using the compound semiconductor multilayer film on the second semiconductor substrate.

10. A method of manufacturing a semiconductor article according to claim 9, wherein the island-shaped compound semiconductor multilayer film formed on the first semiconductor substrate surrounded by the first groove has a rectangle shape having a long side and a short side, and a plurality of the second grooves passing through the second semiconductor substrate are intermittently disposed in an array in parallel with the direction of the long side (longitudinal direction) thereof.

11. A method of manufacturing a semiconductor article according to claim 9, further comprising the steps of:

forming an electrode on the island-shaped compound semiconductor multilayer film via an insulating member to form a light-emitting device array chip having a long side direction and a short side direction, after separating the first semiconductor substrate; and cutting the second semiconductor substrate in a direction of the long side so that the second grooves in parallel with one another which are provided in the second semiconductor substrate and are arranged in the direction of the short side are connected to each other.

12. A method of manufacturing a semiconductor article according to claim 1,
wherein: the compound semiconductor multilayer film comprises a light-emitting layer; the first structure further comprises a DBR layer formed on the compound semiconductor multilayer film; the light-emitting layer is divided into an array of a plurality of light-emitting portions; and a semiconductor circuit is formed on the second semiconductor substrate, and
wherein the method further comprises a step of electrically connecting the plurality of light-emitting portions with an electrode portion of the semiconductor circuit for controlling light emission of the light-emitting portions.

13. A method of manufacturing a semiconductor article according to claim 1, wherein the top view of the shape of the compound semiconductor multilayer film patterned in an island shape by the first groove is a rectangle having a long side direction and a short side direction, and wherein a plurality of the second grooves passing through the second semiconductor substrate is formed so as to be in parallel in the direction of the long side to thereby form a passing-through groove group in the direction of the long side, in which a plurality of the passing-through groove groups in the direction of the long side is arranged so as to be in parallel with one another at intervals which are equal to or longer than the length of the short side of the island-shaped compound semiconductor multilayer film.

14. A method of manufacturing a semiconductor article according to claim 1, wherein a reflector is provided between the compound semiconductor multilayer film and the second semiconductor substrate.

* * * * *